United States Patent
Ryu et al.

(10) Patent No.: US 11,366,716 B2
(45) Date of Patent: Jun. 21, 2022

(54) SEMICONDUCTOR MEMORY DEVICES

(71) Applicant: SAMSUNG ELECTRONICS CO., LTD., Suwon-si (KR)

(72) Inventors: Yesin Ryu, Seoul (KR); Namsung Kim, Yongin-si (KR); Sanguhn Cha, Suwon-si (KR); Jaeyoun Youn, Seoul (KR); Kijun Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/088,900

(22) Filed: Nov. 4, 2020

(65) Prior Publication Data

US 2021/0311821 A1    Oct. 7, 2021

(30) Foreign Application Priority Data

Apr. 1, 2020 (KR) ........................ 10-2020-0039597

(51) Int. Cl.
*G06F 11/10* (2006.01)
*H01L 25/065* (2006.01)

(52) U.S. Cl.
CPC ...... *G06F 11/1044* (2013.01); *G06F 11/1016* (2013.01); *G06F 11/1068* (2013.01); *H01L 25/0657* (2013.01); *H01L 2225/06541* (2013.01)

(58) Field of Classification Search
CPC ............ G06F 11/1044; G06F 11/1016; G06F 11/1068; G06F 11/1048; G06F 11/1012; H01L 25/0657; H01L 2225/06541; H01L 25/0652; H01L 25/18; H01L 2224/16145;
(Continued)

(56) References Cited

U.S. PATENT DOCUMENTS 5,293,387 A    3/1994 Booth
5,956,743 A *  9/1999 Bruce ................ G06F 11/1068
                                                711/103
6,675,341 B1   1/2004 Chen et al.
(Continued)

FOREIGN PATENT DOCUMENTS

KR    1020180059149    6/2018

OTHER PUBLICATIONS

Taiwanese Office Action dated Sep. 15, 2021 issued in corresponding Taiwanese Patent Application No. 109138228.
(Continued)

*Primary Examiner* — Albert Decady
*Assistant Examiner* — Enam Ahmed
(74) *Attorney, Agent, or Firm* — F. Chau & Associates, LLC

(57) ABSTRACT

A semiconductor memory device including: a buffer die; memory dies stacked on the buffer die; and TSVs, at least one of the memory dies includes: a memory cell array; an error correction code (ECC) engine; an error information register; and a control logic circuit configured to control the ECC engine to perform a read-modify-write operation, wherein the control logic circuit is configured to: record, in the error information register, a first address associated with a first codeword based on the an generation signal and a first syndrome obtained by an ECC decoding; and determine an error attribute of the first codeword based on a change of the first syndrome, recorded in the error information register, based on a plurality of read-modify-write operations.

20 Claims, 21 Drawing Sheets

(58) Field of Classification Search
CPC . H01L 2225/06513; H01L 2924/15311; G11C 29/42; G11C 5/06; G11C 29/781
USPC .................................................. 714/763
See application file for complete search history.

(56) References Cited

U.S. PATENT DOCUMENTS

| | | | |
|---|---|---|---|
| 7,085,971 B2 | 8/2006 | Barth, Jr. et al. | |
| 7,178,086 B2 | 2/2007 | Hassner et al. | |
| 7,945,840 B2* | 5/2011 | Schreck | G06F 11/106 714/762 |
| 8,234,554 B2 | 7/2012 | Bernstein et al. | |
| 8,484,543 B2 | 7/2013 | Anand et al. | |
| 8,640,005 B2 | 1/2014 | Wilkerson et al. | |
| 9,043,674 B2 | 5/2015 | Wu et al. | |
| 9,432,298 B1* | 8/2016 | Smith | H04L 49/9057 |
| 9,535,784 B2 | 1/2017 | Cordero et al. | |
| 9,575,835 B2 | 2/2017 | Vogelsang et al. | |
| 9,691,505 B2 | 6/2017 | Das et al. | |
| 9,886,340 B2 | 2/2018 | Ahn et al. | |
| 10,128,869 B2 | 11/2018 | Tate et al. | |
| 10,372,531 B2 | 8/2019 | Prathapan et al. | |
| 10,884,855 B1* | 1/2021 | Yazovitsky | G06F 11/1068 |
| 2004/0153902 A1* | 8/2004 | Machado | G06F 11/1068 714/710 |
| 2005/0044467 A1* | 2/2005 | Leung | G06F 11/1048 714/763 |
| 2007/0226590 A1* | 9/2007 | Nagai | G11C 11/4096 714/763 |
| 2014/0310569 A1* | 10/2014 | Bloom | G06F 11/1052 714/763 |
| 2018/0060165 A1 | 3/2018 | Kim | |
| 2018/0137005 A1* | 5/2018 | Wu | G11C 11/4093 |
| 2018/0143873 A1 | 5/2018 | Ware et al. | |
| 2018/0189135 A1* | 7/2018 | Naik | G11C 16/26 |

OTHER PUBLICATIONS

Taiwanese Office Action and Search Report dated Dec. 16, 2021 issued in corresponding Taiwanese Patent Application No. 109138228.

* cited by examiner

| | FAI_CID1 | SDRI | ATT |
|---|---|---|---|
| Idx21 → | BA/RA/CA_11 | SDR1 | ATTa |
| Idx22 → | BA/RA/CA_12 | SDR2 | ATTb |
| ⋮ | ⋮ | ⋮ | ⋮ |
| Idx2u → | BA/RA/CA_1u | SDRu | ATTc |
| | 581 | 582 | 583 |

SEMICONDUCTOR MEMORY DEVICES

CROSS-REFERENCE TO RELATED APPLICATION

This application claims priority under 35 U.S.C. § 119 to Korean Patent Application No. 10-2020-0039597, filed on Apr. 1, 2020, in the Korean Intellectual Property Office (KIPO), the disclosure of which is incorporated by reference herein in its entirety.

1. Technical Field

Exemplary embodiments of the inventive concept relate to memories, and more particularly to semiconductor memory devices capable of using error correction code (ECC) information in repairing defective cells.

2. Discussion of the Related Art

Both the capacity and speed of a semiconductor memory, which may be used as a storage device in memory systems, are increasing. Accordingly, various attempts are being made to make a memory with a large capacity and small footprint and for a way to efficiently operate the memory.

Recently, to increase the integration of a semiconductor memory, a 3-dimensional (3D) structure including a plurality of stacked memory chips is being used. Nevertheless, due to the demand for large integration and large capacity memories, a 3D stacked structure of the memory chips is being reduced in size.

SUMMARY

According to an exemplary embodiment of the inventive concept, there is provided a semiconductor memory device including: a buffer die; a plurality of memory dies stacked on the buffer die; and a plurality of through silicon vias (TSVs) connecting the plurality of memory dies to the buffer die, wherein at least one of the plurality of memory dies includes: a memory cell array which includes a plurality of memory cell rows, each row including a plurality of volatile memory cells; an error correction code (ECC) engine; an error information register; and a control logic circuit configured to control the ECC engine to perform a read-modify-write operation by: reading data corresponding to a first codeword from a sub-page in a first memory cell row among the plurality of memory cell rows based on an access address and a command; performing an ECC decoding on the data to generate an error generation signal in response to detecting an error in the first codeword; correcting the detected error in the first codeword; and writing a corrected first codeword in a first memory location corresponding to the sub-page, wherein the control logic circuit is configured to: record, in the error information register, a first address associated with the first codeword based on the error generation signal and a first syndrome obtained by the ECC decoding; and determine an error attribute of the first codeword based on a change of the first syndrome, recorded in the error information register, based on a plurality of read-modify-write operations.

According to an exemplary embodiment of the inventive concept, there is provided a semiconductor memory device including: a memory cell array which includes a plurality of memory cell rows, each row including a plurality of volatile memory cells; an ECC engine; an error information register; and a control logic circuit configured to control the ECC engine to perform a read-modify-write operation by: reading data corresponding to a first codeword from a sub-page in a first memory cell row among the plurality of memory cell rows based on an access address and a command; performing an ECC decoding on the data to generate an error generation signal in response to detecting an error in the first codeword; correcting the detected error in the first codeword; and writing a corrected first codeword in a first memory location corresponding to the sub-page, wherein the control logic circuit is configured to: record, in the error information register, a first address associated with the first codeword based on the error generation signal and a first syndrome obtained by the ECC decoding; and determine an error attribute of the first codeword based on a change of the first syndrome, recorded in the error information register, based on a multiple read-modify-write operations.

According to an exemplary embodiment of the inventive concept, there is provided a semiconductor memory device including: a memory cell array which includes a plurality of memory cell rows, each row including a plurality of volatile memory cells; an ECC engine; an error information register; and a control logic circuit configured to control the ECC engine to perform a read-modify-write operation by: reading data corresponding to a first codeword from a sub-page in a first memory cell row among the plurality of memory cell rows based on an access address and a command from an external device; performing an ECC decoding on the data to generate an error generation signal in response to detecting an error in the first codeword; correcting the detected error in the first codeword; and writing a corrected first codeword in a first memory location corresponding to the sub-page; and the semiconductor memory device further includes a storage memory to store the first address designating the first memory location as a hard fault or a progressive fault and its associated corrected data, wherein the control logic circuit is configured to: record, in the error information register, a first address associated with the first codeword based on the error generation signal and a first syndrome obtained by the ECC decoding; and determine an error attribute of the first codeword based on a change of the first syndrome, recorded in the error information register, based on a plurality of read-modify-write operations.

BRIEF DESCRIPTION OF THE DRAWINGS

FIG. 16 is an example of an error information register in the peripheral circuit in FIG. 12 according to exemplary embodiments of the inventive concept.

DETAILED DESCRIPTION OF THE EMBODIMENTS

Exemplary embodiments of the inventive concept will be described more fully hereinafter with reference to the accompanying drawings.

Figure 1:
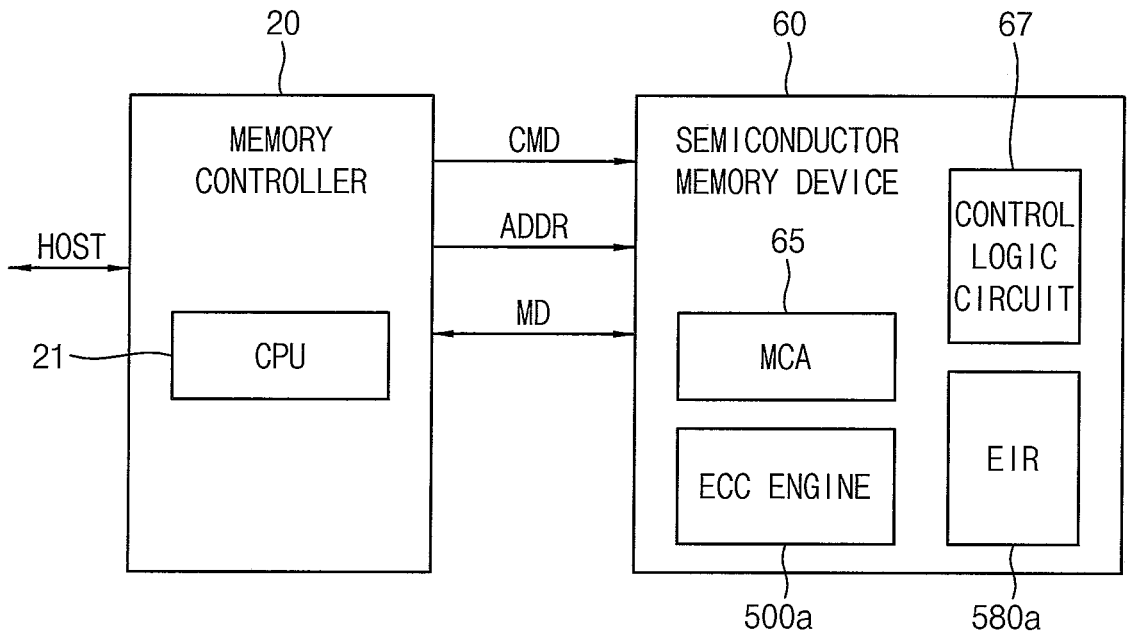
FIG. 1 is a block diagram illustrating a memory system according to exemplary embodiments of the inventive concept.

FIG. 1 is a block diagram illustrating a memory system according to exemplary embodiments of the inventive concept.

Referring to FIG. 1, a memory system 10 includes a memory controller 20 and a semiconductor memory device 60. The memory controller 20 may include a central processing unit (CPU) 21, may provide a command (e.g., a signal) CMD, and an address (e.g., a signal) ADDR to the semiconductor memory device 60, and may exchange a main data MD with the semiconductor memory device 60.

The memory controller 20 may access the semiconductor memory device 60 based on a request from an external host. For example, the host may request the memory controller 20 to perform a read or write operation on the semiconductor memory device 60. The memory controller 20 may communicate with the host through various protocols. The CPU 21 may control overall operations of the memory controller 20.

The semiconductor memory device 60 may include a memory cell array (MCA) 65, a control logic circuit 67, an error correction code (ECC) engine 500a and an error information register (EIR) 580a.

The memory cell array 65 may include a plurality of memory cell rows, each of the plurality of memory cell rows includes a plurality of volatile memory cells coupled to a plurality of word-lines and a plurality of bit-lines. The volatile memory cells may lose stored information in the absence of power.

The ECC engine 500a, in a write operation of the semiconductor memory device 60, may perform an ECC encoding on the main data MD to store the main data MD and parity data in a target page of the memory cell array 65.

The control logic circuit 67, in a memory access operation on a first memory cell row of the plurality of memory cell rows, controls the ECC engine 500a to perform a read-modify write operation. The ECC engine 500a performs the read-modify write operation by reading data corresponding to a first codeword from a sub-page in the first memory cell row based on an access address and a command provided from the memory controller 20 (e.g., an external device), performing an ECC decoding on the data to generate an error generation signal in response to detecting an error in the first codeword, correcting the detected error in the first codeword, and writing back a corrected first codeword in a first memory location corresponding to the first sub-page.

The memory access operation on the first memory cell row may include a normal read operation, a refresh operation or a scrubbing operation.

In addition, the control logic circuit 67 may record, in the error information register 580a, a first address associated with the first codeword based on the error generation signal and a first syndrome obtained by the ECC decoding. In addition, the control logic circuit 67 may determine an error attribute of the first codeword based on a change of the first syndrome, recorded in the error information register 580a, based on multiple read-modify-write operations. Herein, multiple read-modify-write operations may refer to read-modify-write operations that are performed a plurality of times.

When the control logic circuit 67 determines the error attribute as a hard fault or a progressive fault, the control logic circuit 67 may selectively repair the first memory location based on the determined error attribute. The control logic circuit 67 may repair the first memory location by replacing an address of the first memory location with an address of a redundancy region. The control logic 67 may repair the first memory location by storing the address of the first memory location and associated corrected data in a storage memory in the semiconductor memory device 60.

Figure 2:
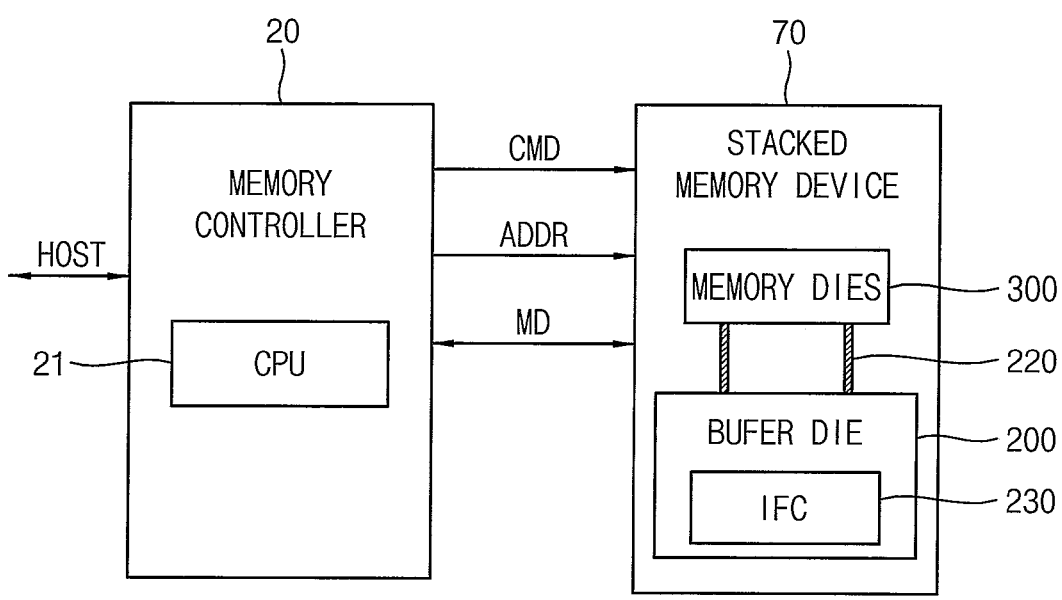
FIG. 2 is a block diagram illustrating a memory system according to exemplary embodiments of the inventive concept.

FIG. 2 is a block diagram illustrating a memory system according to exemplary embodiments of the inventive concept.

Referring to FIG. 2, a memory system 10a includes a memory controller 20 and a semiconductor memory device 70. The semiconductor memory device 70 may include a stacked memory device and may be referred to as a stacked memory device. The memory controller 20 in FIG. 2 is the same as the memory controller 20 of FIG. 1, and thus, a description on the memory controller 20 will be omitted.

The stacked memory device 70 may include a buffer die 200 and a plurality of memory dies 300 stacked on the buffer die 200. The buffer die 200 and the memory dies 300 may be sequentially stacked on each other. The memory dies 300 stacked on the buffer die 200 may be electrically connected to the buffer die 200 through a conducting means. The conducting means may be one or more through silicon via (TSV)s 220. The memory dies 300 may store data.

The buffer die 200 may communicate with the memory controller 20 and each of the memory dies 300 may be a dynamic random access memory (DRAM) device including a plurality of dynamic memory cells, such as Double Data Rate (DDR) Synchronous Dynamic Random Access Memory (SDRAM). Each of the memory dies 300 may include a memory cell array, an ECC engine, a control logic circuit and an error information register. For example, each of the memory dies 300 may include the memory cell array 65, the ECC engine 500a, the control logic circuit 67 and the error information register 580a shown in FIG. 1.

The buffer die 200 may include an interface circuit 230 and the interface circuit 230 may include a storage memory. The interface circuit 230 is coupled to the TSVs 220, and may perform a soft post package repair (PPR) by storing a fail address and associated corrected data, which are provided from at least one of the memory dies 300 via TSVs 220, in the storage memory. When a second address from the memory controller 20 matches the fail address after the fail address and the associated corrected data are stored in the storage memory, the interface circuit 230 may control the storage memory such that data is input/output via the storage memory, FIG. 3 is a block diagram illustrating an example of the memory controller in FIG. 2 according to exemplary embodiments of the inventive concept.

Figure 3:
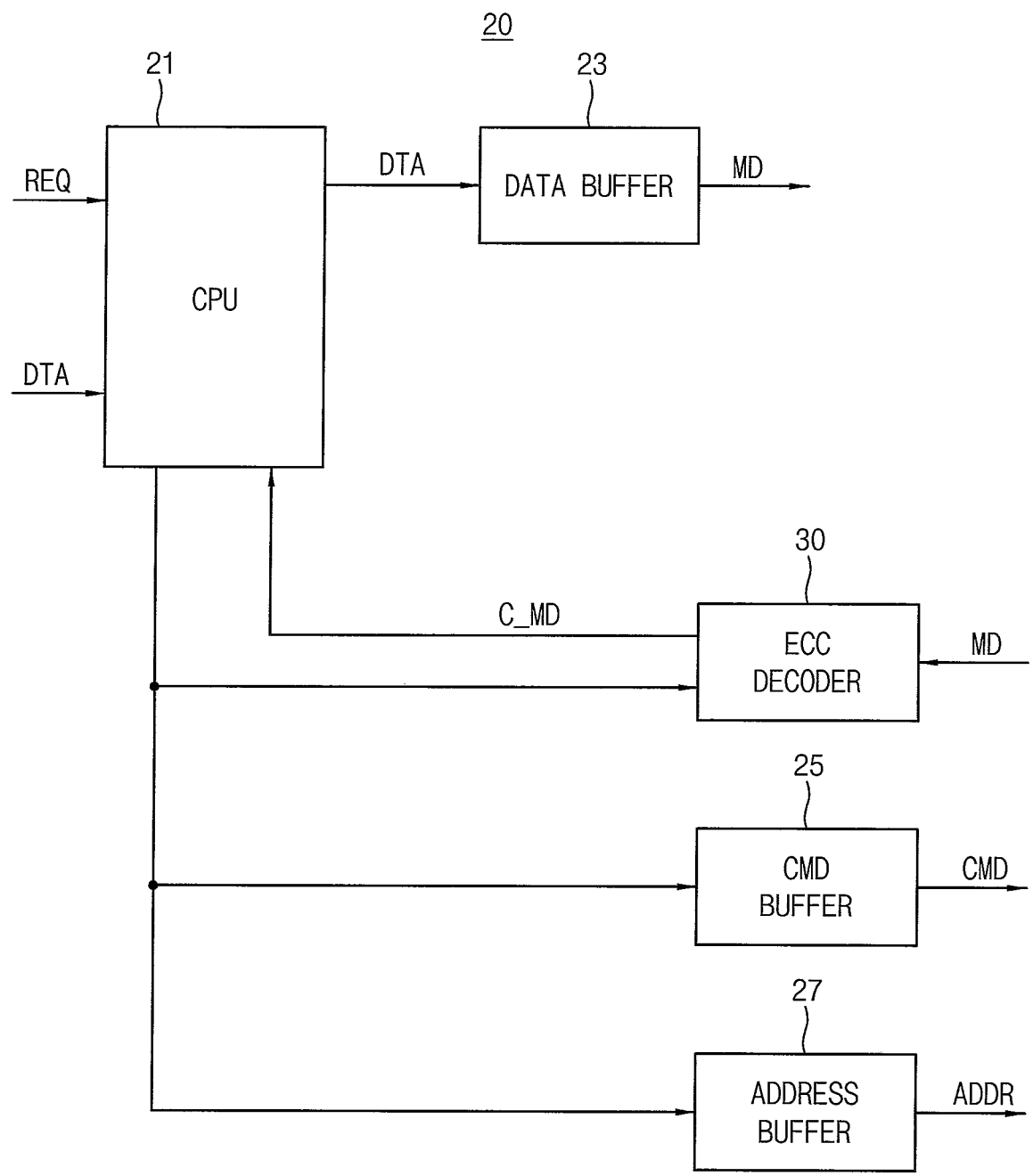
FIG. 3 is a block diagram illustrating an example of a memory controller in FIG. 2 according to exemplary embodiments of the inventive concept.

Referring to FIG. 3, the memory controller 20 may include the CPU 21, a data buffer 23, an ECC decoder 30, a command buffer 25 and an address buffer 27. In an exemplary embodiment of the inventive concept, the ECC decoder 30 may not be included in the memory controller 20.

The CPU 21 receives a request REQ and data DTA from the host, and provides the data DTA to the data buffer 23.

The data buffer 23 buffers the data DTA to provide the main data MD to the stacked memory device 70 (or the semiconductor memory device 60).

The ECC decoder 30, in a read operation, receives the main data MD from the stacked memory device 70, performs an ECC decoding on the main data MD to correct at least one error in the main data MD and provides a corrected data C_MD to the CPU 21.

The command buffer 25 stores the command CMD corresponding to the request REQ and transmits the command CMD to the stacked memory device 70 under control of the CPU 21. The address buffer 27 stores the address ADDR corresponding to the request REQ and transmits the address ADDR to the stacked memory device 70 under control of the CPU 21.

Figure 4:
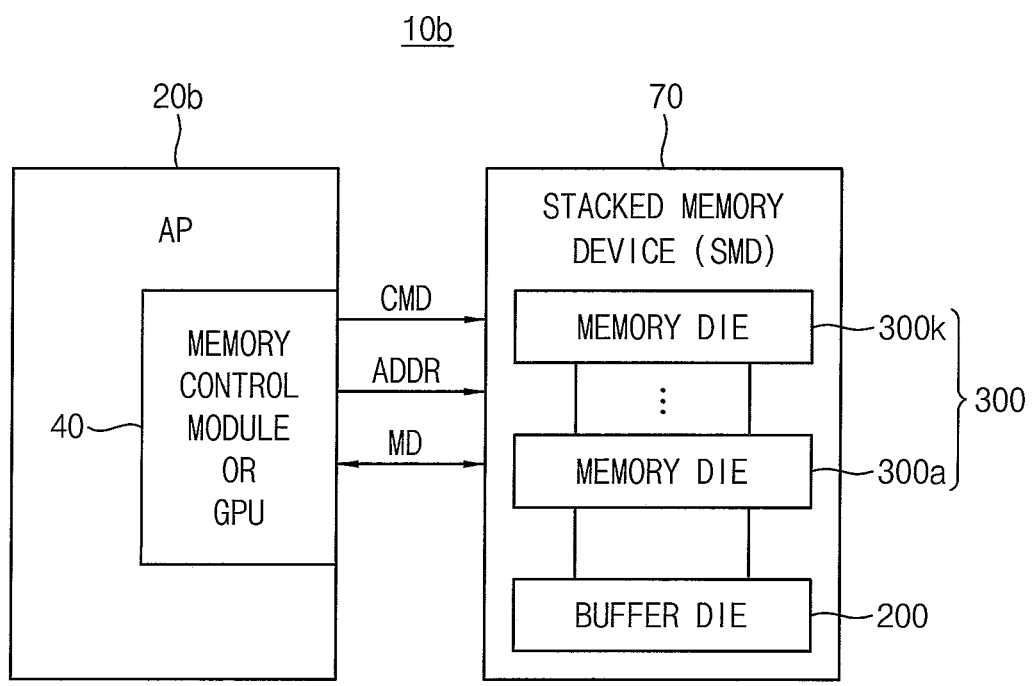
FIG. 4 is a block diagram illustrating a data processing system according to example embodiments of the inventive concept.

FIG. 4 is a block diagram illustrating a data processing system according to example embodiments of the inventive concept.

Referring to FIG. 4, a data processing system (or, a memory system) 10b may include an application processor 20b and a stacked memory device 70. The application processor 20b may include a memory control module 40. The memory control module 40 included in application processor 20b and the stacked memory device 70 may constitute a memory system. The stacked memory device 70 includes a buffer die 200 and memory devices 300 and the memory dies 300 include a plurality memory dies 300a~300k which are stacked on top of each other.

The application processor 20b may perform a function of the host. Further, the application processor 20b may be implemented as a system on chip (SoC). The SoC may include a system bus to which a protocol having a predetermined standard bus specification is applied, and may include various types of intellectual property (IP) cores connected to the system bus.

The memory control module 40 may perform a function of the memory controller 20 in FIG. 2.

In exemplary embodiments of the inventive concept, the application processor 20b may include a graphic processing unit (GPU) instead of the memory control module 40 and the GPU may perform a function of the memory controller 20 in FIG. 2. The GPU may store, in the stacked memory device 70, data which is generated during graphic processing.

Figure 5:
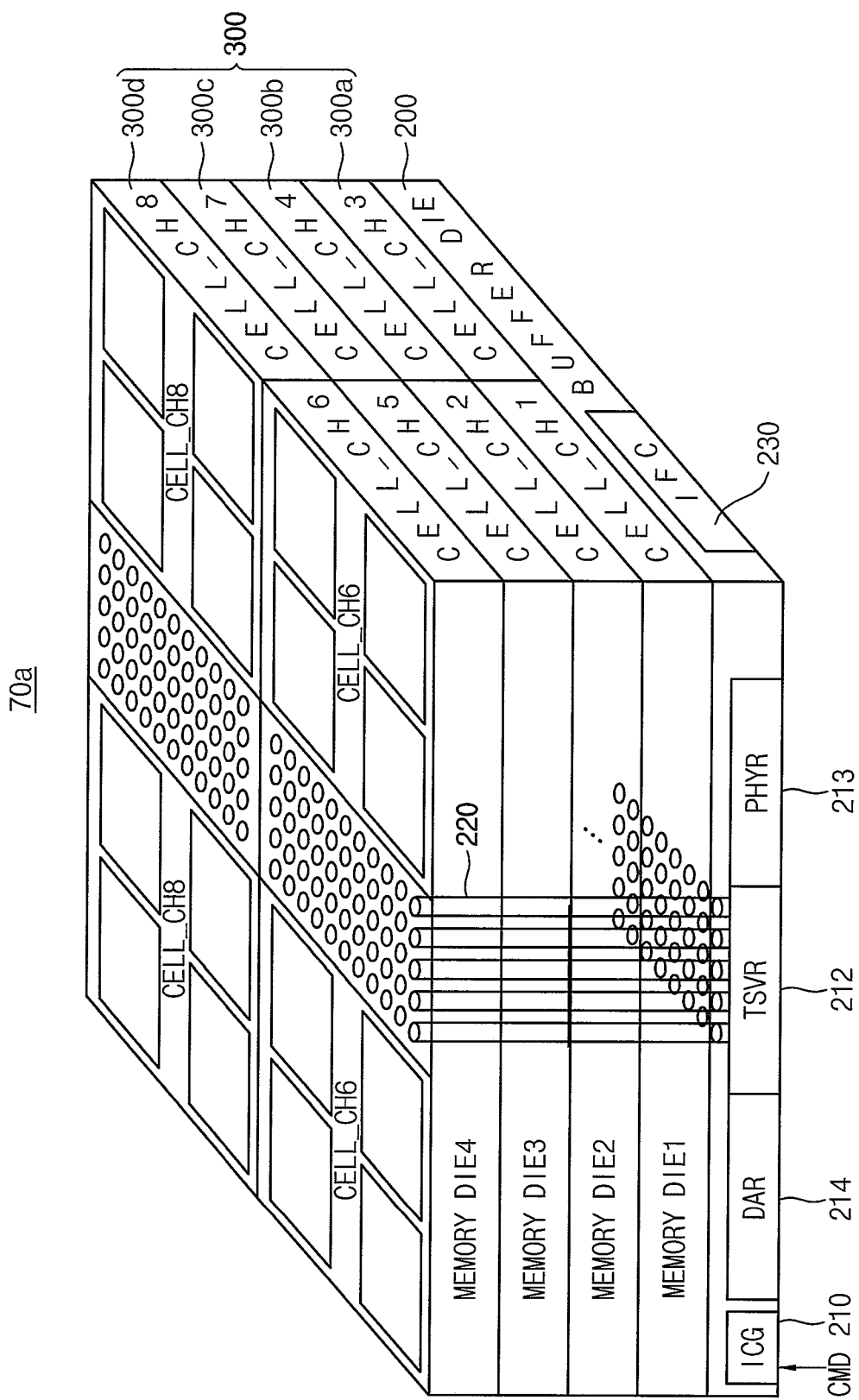
FIG. 5 is a block diagram illustrating an example of a stacked memory device in FIG. 2 according to exemplary embodiments of the inventive concept.

FIG. 5 is a block diagram illustrating an example of the stacked memory device in FIG. 2 according to exemplary embodiments of the inventive concept.

In FIG. 5, a memory device in a high bandwidth memory (HBM) formed to have an increased bandwidth by including a plurality of independent channels having independent interfaces is illustrated.

Referring to FIG. 5, a stacked memory device 70a may include a plurality of layers. For example, the stacked memory device 70a may include the buffer die 200 and one or more memory dies 300 which are stacked on buffer die 200. In the example of FIG. 5, although first, second, third and fourth memory dies 300a, 300b, 300c and 300d are illustrated, the number of the core dies may be variously changed.

Further, each of the memory dies 300 may include one or more channels. A single memory die includes two channels in the example of FIG. 5, and thus, an example in which the stacked memory device 70a has eight channels CH1, CH2, CH3, CH4, CH5, CH6, CH7 and CH8 is illustrated.

For example, a first memory die 300a may include a first channel CH1 and a third channel CH3, a second memory die 300b may include a second channel CH2 and a fourth channel CH4, a third memory die 300c may include a fifth memory channel CH5 and a seventh channel CH7, and a fourth memory die 300d may include a sixth channel CH6 and an eighth channel CH8.

The buffer die 200 may communicate with the memory controller 20 (e.g., an external device), receive a command, an address, and data from the memory controller, and provide the received command, address, and data to the memory dies 300. The buffer die 200 may communicate with the memory controller 20 through a conductive means such as bumps and the like which are formed on an outer surface thereof. The buffer die 200 may buffer the command, the address, and the data, and thus, the memory controller 20 may interface with the memory dies 300 by driving only a load of the buffer die 200.

Further, the stacked memory device 70a may include a plurality of TSVs 220 passing through the layers.

The TSVs 220 may be disposed corresponding to the plurality of channels CH1 to CH8, may be disposed to pass through the first to fourth memory dies 300a to 300d, and each of the first to fourth memory dies 300a to 300d may include a transmitter/receiver connected to the TSVs 220. When a normal operation in which the inputting and outputting of the data is independently performed for each channel, only the transmitter/receiver of any one core die may be enabled, with respect to each of the TSVs 220, and thus, each of the TSVs 220 may independently deliver only the data of any one memory die, or any channel, as an independent channel for that one memory die or channel. In other words, an individual TSV 220 may function as an independent channel.

The buffer die 200 may include an internal command generator 210, the interface circuit 230, a TSV region TSVR 212, a physical region PHYR 213 and a direct access region DAR 214. The internal command generator 210 may generate an internal command based on the command CMD. The interface circuit 230 may include a storage memory such as a static random access memory (SRAM) device.

The TSV region 212 is a region in which TSVs 220 for communicating with the memory dies 300 are formed. The physical region 213 is a region including a plurality of input-and-output (IO) circuits for communicating with an external memory controller 20. Various types of signals from the memory controller 20 may be provided to the TSV region 212 through the physical region 213 and to the memory dies 300 through the TSVs 220.

The direct access region 214 may directly communicate with an external test device in a test mode for the stacked memory device 70a through a conductive means which is disposed on an outer surface of the stacked memory device 70a. Various types of signals provided from the external test device may be provided to the memory dies 300 through the direct access region 214 and the TSV region 212.

The interface circuit 230 may provide the address and the data from the external device to a target memory die (e.g., one of the memory dies 300a to 300d) and may provide the external device with a main data form the target memory die. In addition, the interface circuit 230 may store a fail address and associated corrected data from the target memory die in the storage memory.

Figure 6:
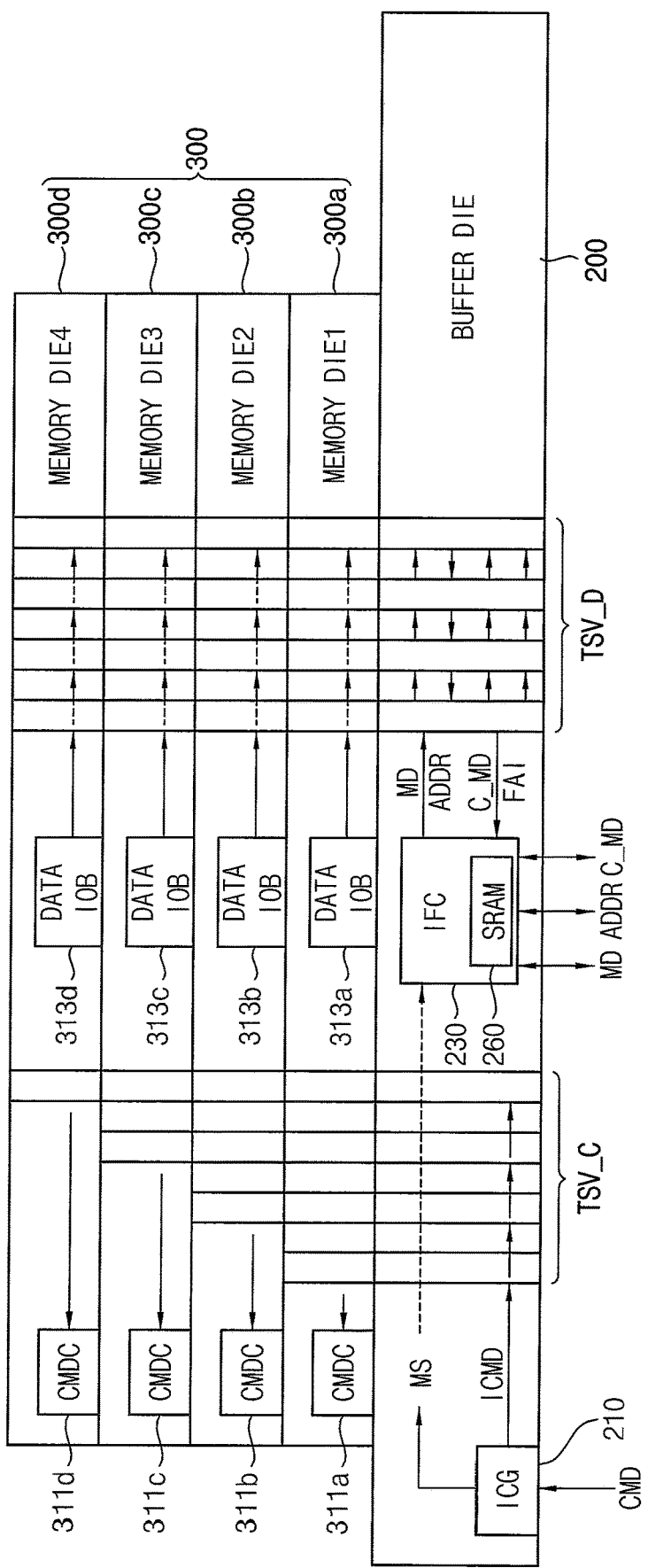
FIG. 6 illustrates an operation of an interface circuit in the stacked memory device of FIG. 5 according to exemplary embodiments of the inventive concept.

FIG. 6 illustrates an operation of the interface circuit in the stacked memory device of FIG. 5, according to exemplary embodiments of the inventive concept.

Referring to FIGS. 5 and 6, the buffer die 200 includes the internal command generator 210 and the interface circuit 230. Internal commands ICMD from the internal command generator 210 are provided to the memory dies 300 through command TSVs TSV_C which are independently provided for each channel. The internal command generator 210 may provide the interface circuit 230 with a mode signal MS designating one of a plurality of operation modes based on the command CMD.

The interface circuit 230 may include an SRAM 260. The interface circuit 230 may provide the main data MD to a corresponding memory die through data TSVs TSV_D which are commonly provided for each channel in a first mode of the write operation in response to the mode signal MS.

The interface circuit 230 may provide the external device with the main data MD provided from the target memory die through the data TSVs TSV_D. In addition, the interface circuit 230, in a memory access operation including a read operation, may store in the SRAM 260, fail address information FAI and associated corrected data C_MD associated with a first memory location in the target memory die, which are provided from the target memory die. An error attribute of the first memory location may be determined as hard fault or progressive fault.

The SRAM 260 may be referred to as the storage memory and may be replaced with another type of memory capable of storing the fail address information FAI and the associated corrected data C_MD.

The memory dies 300 may respectively include command decoders 311a, 311b, 311c and 311d which output internal control signals by decoding internal commands, and data input/output (I/O) buffers 313a, 313b, 313c and 313d which perform a processing operation on read data or data to be written.

Referring to one of the memory dies 300 (for example, the first memory die 300a), the first memory die 300a may perform a memory operation according to a decoding result of command decoder 311a, and for example, data of a plurality of bits stored in a memory cell region inside the first memory die 300a may be read and provided to the data I/O buffer 313a. The data I/O buffer 313a may process the data of the plurality of bits in parallel, and output the data processed in parallel to a plurality of data TSVs TSV_D in parallel.

Figure 7:
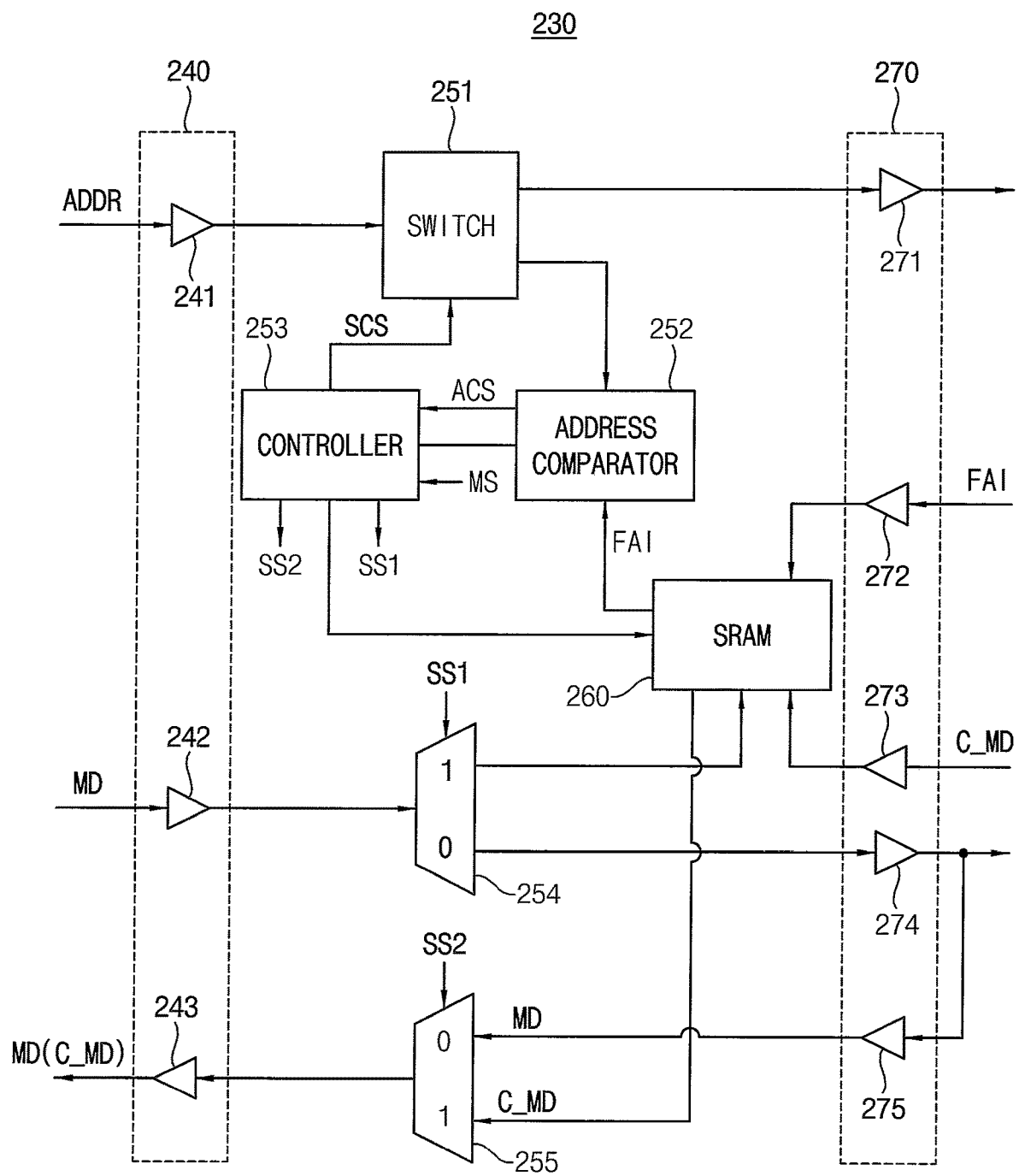
FIG. 7 is a block diagram illustrating an example of the interface circuit in FIG. 6 according to exemplary embodiments of the inventive concept.

FIG. 7 is a block diagram illustrating an example of the interface circuit in FIG. 6 according to exemplary embodiments of the inventive concept.

Referring to FIG. 7, the interface circuit 230 may include a first path control circuit 240, a second path control circuit 270, a switch 251, an address comparator 252, a controller 253, a demultiplexer 254, a multiplexer 255 and the SRAM 260.

The first path control circuit 240 includes buffers 241, 242 and 243 and the second path control circuit 270 includes buffers 271, 272, 273, 274 and 275.

The buffer 241 provides the address ADDR to the switch 251 and the switch 251 may provide the address ADDR to one of the buffer 271 and the address comparator 252 in response to a switching control signal SCS. The buffer 271 provides the address ADDR to the target memory die.

The buffer 272 may provide the SRAM 260 with the fail address information FAI from the target memory die. The buffer 273 may provide the SRAM 260 with the corrected data C_MD from the target memory die.

The SRAM 260 may provide the fail address information FAI to the address comparator 252 and may provide the corrected data C_MD to the multiplexer 255. The address comparator 252 may compare the address ADDR from the external device with the fail address information FAI and may provide the controller 253 with an address comparison signal ACS based on a result of the comparison.

The controller 253 may provide the switching control signal SCS to the switch 251, may provide the selection signal SS1 to the demultiplexer 254 and may provide a selection signal SS2 to the multiplexer 255, based on the mode signal MS and the address comparison signal ACS.

The buffer 275 may provide the multiplexer 255 with the main data MD from the target memory die. The multiplexer 255 may provide the main data MD to the buffer 243 in a normal mode and may provide the corrected data C_MD to the buffer 243 in a repair mode, based on the selection signal SS2. The buffer 243 may provide the external device with one of the main data MD or the corrected data C_MD.

The target memory die may store, in the SRAM 260 as the fail address information FAI, an address of the first memory location which the ECC engine (e.g., 500a in FIG. 1)

determines as a hard fault or a progressive fault and may store the corrected data associated with the first memory location in the SRAM 260.

Therefore, after the fail address information FAI and the associated corrected data C_MD are stored in the SRAM 260, the address comparator 252 compares the address ADDR with the fail address information FAI and provides the controller 253 with the address comparison signal ACS based on a result of the comparison. The controller 253 may output the selection signals SS1 and SS2 with a logic high level in response to the address ADDR matching one of fail addresses in the fail address information FAI.

In addition, when at least some of the fail address information FAI are programmed in a fuse circuit during an idle time of the stacked memory device, the controller 253 may reset the some of the fail address information FAI which are programmed, in the SRAM 260.

Figure 8:
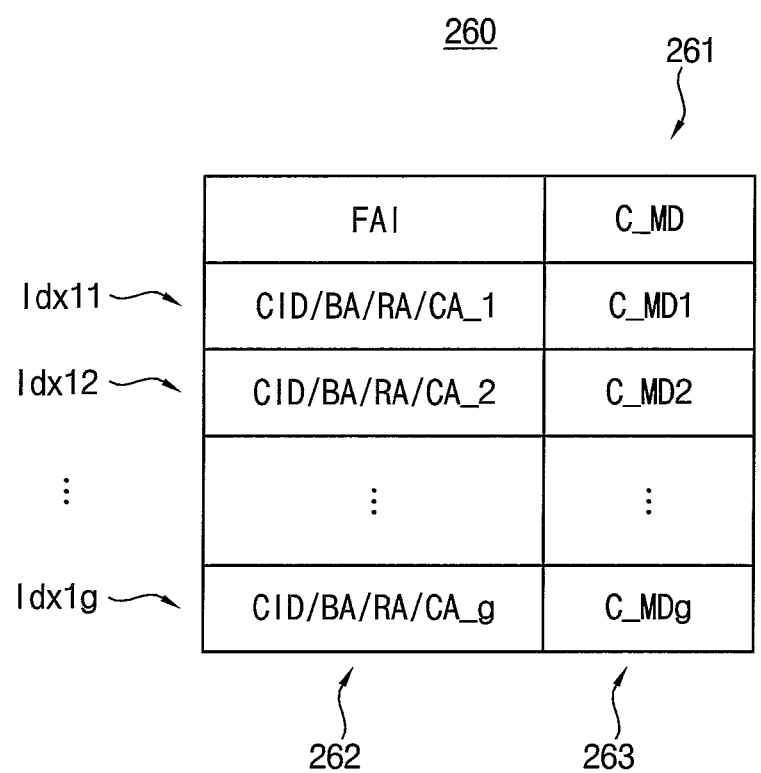
FIG. 8 illustrates an example of a static random access memory (SRAM) in FIG. 8 according to exemplary embodiments of the inventive concept.

FIG. 8 illustrates an example of the SRAM in FIG. 8 according to exemplary embodiments of the inventive concept.

Referring to FIG. 8, the SRAM 260 may include a storage table 261 that stores the fail address information FAI and corresponding corrected data C_MD.

Each of indexes (e.g., entries) Idx11, Indx12, . . . , Idx1g (g is a natural number greater than two) of the storage table 261 may include the fail address information FAI and the corresponding corrected data C_MD provided from at least some of the memory dies 300a~300k.

The storage table 261 includes a first column 262 and a second column 263. The first column 262 may store chip identifier/bank address/row address/column addresses CID/BA/RA/CA_1, CID/BA/RA/CA_2, . . . , CID/BA/RA/CA_g associated with a memory die including a defective memory location (or region), which the control logic circuit (e.g., 67 in FIG. 1) determines as a hard fault or a progressive fault, as the fail address information FAI. The second column 263 may store corrected data C_MD1, C_MD2, . . . , C_MDg associated with the chip identifier/bank address/row address/column addresses CID/BA/RA/CA_1, CID/BA/RA/CA2, . . . , CID/BA/RA/CA_g respectively as the corrected data C_MD.

At least some of the chip identifier/bank address/row address/column addresses CID/BA/RA/CA_1, CID/BA/RA/CA_2, . . . , CID/BA/RA/CA_g may be associated with the same memory die, and at least some of the chip identifier/bank address/row address/column addresses CID/BA/RA/CA_1, CID/BA/RA/CA_2, . . . , CID/BA/RA/CA_g may be associated with different memory dies.

Figure 9:
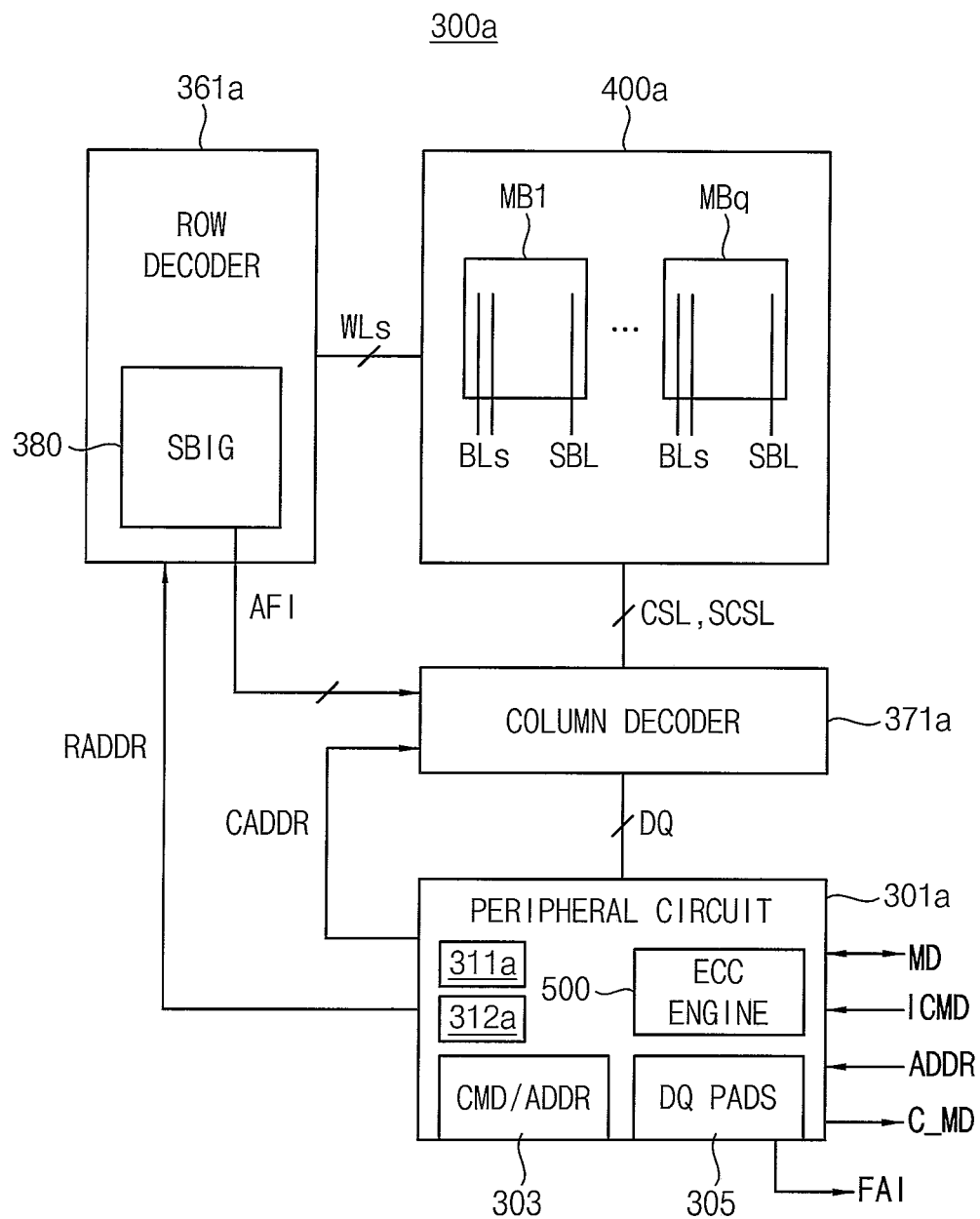
FIG. 9 is a block diagram illustrating an example of a memory die in a stacked memory device in FIG. 4 according to exemplary embodiments of the inventive concept.

FIG. 9 is a block diagram illustrating an example of one of the memory dies in the stacked memory device in FIG. 4 according to exemplary embodiments of the inventive concept.

In FIG. 9, a configuration of the memory die 300a is illustrated, and each configuration of the plurality of memory dies 300b~300k may be substantially the same as the configuration of the memory die 300a.

Referring to FIG. 9, the memory die 300a includes a memory cell array 400a, a row decoder 361a, a column decoder 371a and/or a peripheral circuit 301a, but the inventive concept is not limited thereto.

The memory cell array 400a may include a plurality of memory blocks MB1~MBq (where, q is an integer greater than one), and each of the memory blocks MB1~MBq includes memory cells coupled to word-lines WLs and bit-lines BLs and spare cells coupled to the word-lines WLs and at least one spare bit-line SBL. The plurality of memory blocks MB1~MBq may share the word-line WLs and but not the bit-lines BLs and the spare bit-line SBL. Data associated with each of the memory blocks MB1~MBq may be input/output through a corresponding input/output pad.

The memory die 300a may receive an active command before receiving a write command and/or a read command from the outside (e.g., a memory controller and/or test equipment, another external source device, etc.). All memory cells connected to the word-lines WLs of the memory die 300a may be selected based on the active command. Afterwards, if the memory die 300a receives the write command and/or the read command, a plurality of bit-lines BLs may be selected. In an exemplary embodiment of the inventive concept, the bit-lines BLs illustrated in the memory blocks MB1~MBq may be selected by the write command and/or the read command. The data input/output may be performed on memory cells coupled to the selected bit-lines BLs.

Additionally, according to an exemplary embodiment of the inventive concept, parity data for correction errors of data stored in at least one of the memory blocks MB1~MBq may be stored in some of the memory blocks MB1~MBq, but the inventive concept is not limited thereto.

The column decoder 371a may be connected to the memory cell array 400a through column selection lines CSL and spare column selection lines SCSL. The column decoder 371a may select the column selection lines CSL and/or the spare column selection lines SCSL based on a write command and/or a read command. If the column decoder 371a selects the column selection lines CSL, the bit-lines BLs are selected. When the column decoder 371a selects the spare column selection lines SCSL, the spare bit-lines SBL are selected.

The peripheral circuit 301a may include command/address pads (CMD/ADD) 303, input/output (or DQ) pads 305, and an ECC engine 500.

In an exemplary embodiment of the inventive concept, the ECC engine 500 may not be included in the peripheral circuit 301a. The peripheral circuit 301a may receive the internal command ICMD from the internal command generator 210, may receive the address ADDR from the interface circuit 230 and may exchange the main data MD with the external device. The peripheral circuit 301a may include the command decoder 311a and/or a mode register 312a.

The peripheral circuit 301a may provide a column address CADDR to the column decoder 371a and/or may provide a row address RADDR to the row decoder 361a according to the command CMD received from the outside (e.g., an external source). The peripheral circuit 301a may provide the main data MD to the column decoder 371a (via DQ line) in response to the write command and/or may receive the main data MD from the column decoder 371a (via DQ line) in response to the read command. The main data MD may be provided to the external device (e.g., a memory controller) through the input/output pad 305 and the interface circuit 230.

According to exemplary embodiments of the inventive concept, the ECC engine 500 may perform an ECC encoding on the input data to generate parity data. The ECC engine 500 may store the input data and the parity data in one or more of the memory blocks MB1~MBq. The ECC engine 500 may perform an FCC decoding on the data read from the one or more memory blocks MB1~MBq to correct at least one error in the read data. The ECC engine 500 may transmit the corrected data to the interface circuit 230 through the input/output pads 205.

The peripheral circuit 301a may provide the fail address information FAI to the interface circuit 230 and the column decoder 371a.

The row decoder 361a may activate a first word-line designated by the row address RADDR in response to the row address RADDR. The row decoder 361a may include a segment information generator 380, and the segment information generator 380 may generate anti-fuse information AFI indicating whether a spare bit-line is used or not.

The column decoder 371a may receive the anti-fuse information AFI and the fail address information FAI and may repair a defective memory region (or location) in each of the memory blocks MB1~MBq based on the anti-fuse information AFI and the fail address information FAI.

Figure 10:
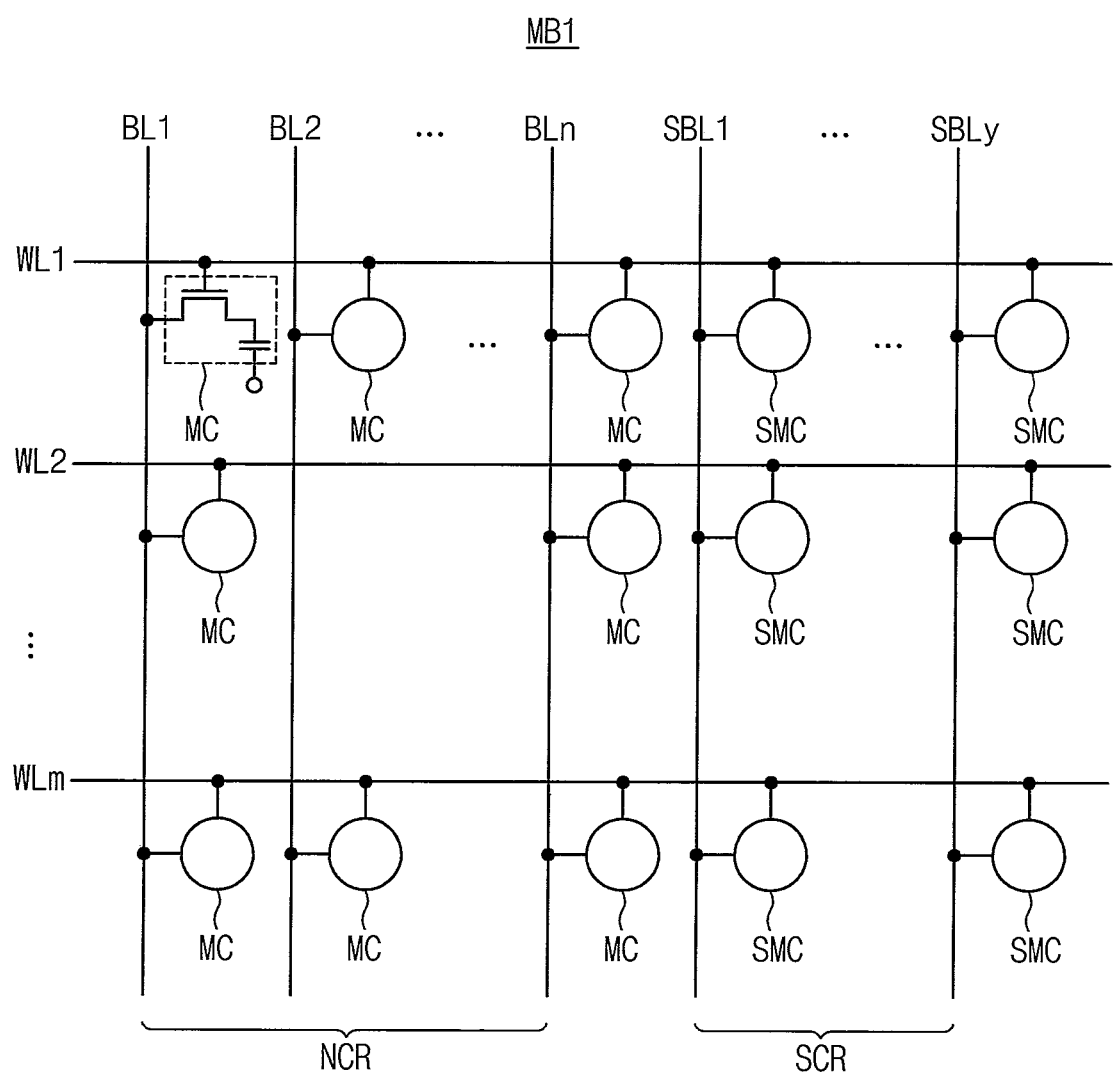
FIG. 10 illustrates an example of a first memory block in the memory die of FIG. 9 according to exemplary embodiments of the inventive concept.

FIG. 10 illustrates an example of a first memory block in the memory die of FIG. 9 according to exemplary embodiments of the inventive concept.

Referring to FIG. 10, the first memory block MB1 includes a normal cell region NCR and/or a spare cell region SCR, etc. The normal cell region NCR includes a plurality of word-lines WL1~WLm (m is a natural number greater than two), a plurality of bit-lines BL1~BLn (n is a natural number greater than two), and a plurality of memory cells MCs disposed at intersections between the word-lines WL1~WLm and the bit-lines BL1~BLn. The spare cell region SCR includes a plurality of spare bit-lines SBL1~SBLy (y is a natural number greater than two), the word-lines WL1~WLm, and a plurality of spare cells SMCs disposed at intersections between the word-lines WL1~WLm and the spare bit-lines SBL1~SBLy. If the some of the memory cells MCs have defects, the memory cells MCs having defects may be repaired using the spare cells SMCs.

The word-lines WL1~WLm extend in a first direction D1 and the bit-lines BL1~BLn and the spare bit-lines SBL1~SBLy extend in a second direction D2 crossing the first direction D1. The first memory block MB1 may be divided into a plurality of segments in the second direction D2 by segment identity bits of the row address.

Figure 11:
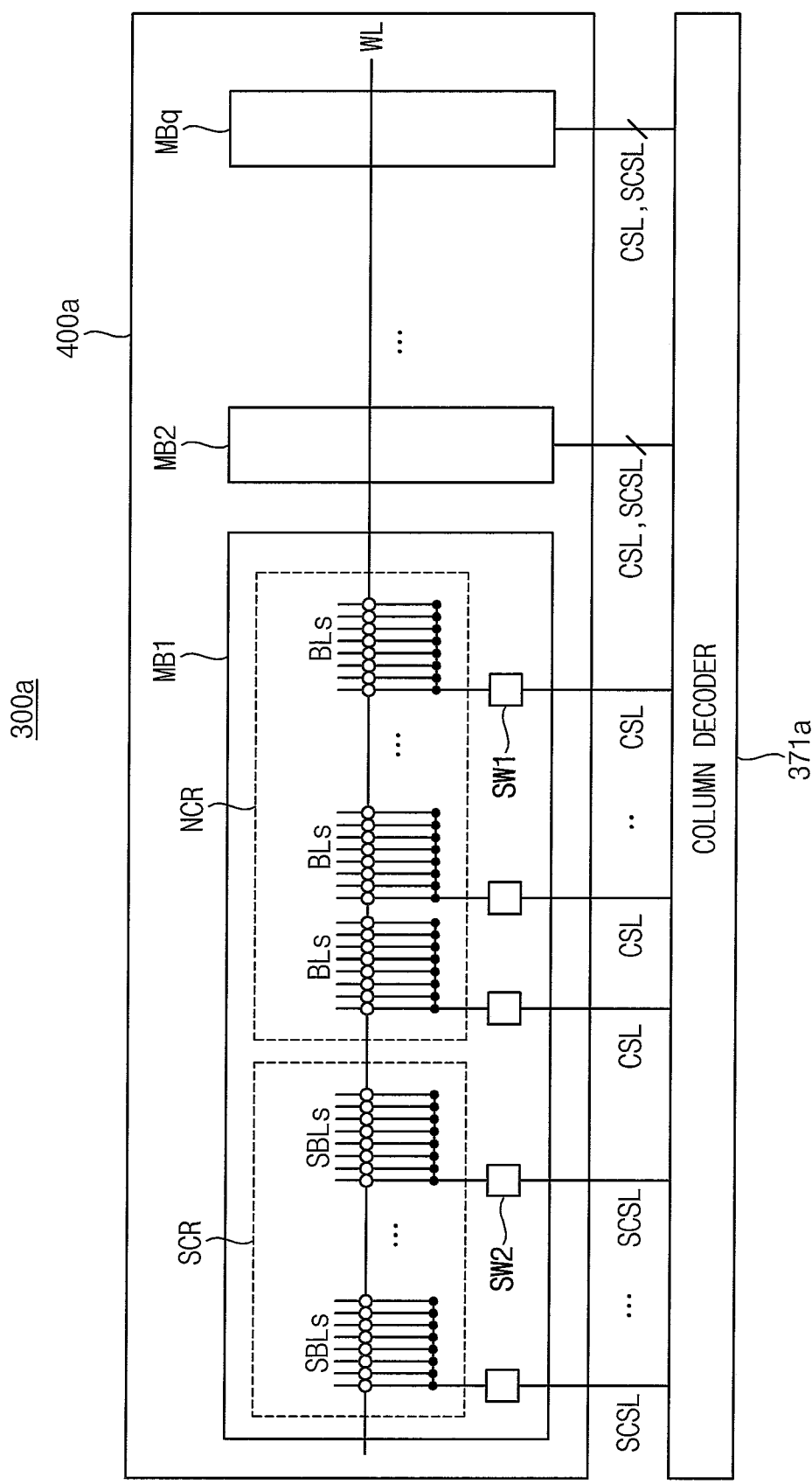
FIG. 11 illustrates a relationship between column selection lines and bit-lines shown in FIG. 10 according to exemplary embodiments of the inventive concept.

FIG. 11 illustrates a relationship between column selection lines and bit-lines shown in FIG. 10 according to exemplary embodiments of the inventive concept.

In FIG. 11, only the first memory block MB1 is shown in detail for brevity of illustration. Each of the memory blocks MB2~MBq may be configured and/or implemented the same as the first memory block MB1, but is not limited thereto. In addition, for brevity of illustration, only one word-line WL is illustrated in FIG. 11, and the peripheral circuit 301a and the row decoder 361a in FIG. 9 are not illustrated.

The column decoder 371a may select the column selection lines CSL of each of the memory blocks MB1~MBq based on the write command and/or the read command. Each of the column selection lines CSL may be connected with a plurality of bit-lines BLs through a switch SW1. The column decoder 371a may selectively select the spare column selection lines SCSL of each of the memory blocks MB1~MBq based on the write command and/or the read command instead of the column selection line CSL.

The spare column selection lines SCSL may be connected with spare bit-lines SBLs through a switch SW2. In an exemplary embodiment of the inventive concept, the column decoder 371a may selectively unselect the column selection line CSL and the spare column selection lines SCSL of each of the memory blocks MB1~MBq based on the write command and/or the read command.

Figure 12:
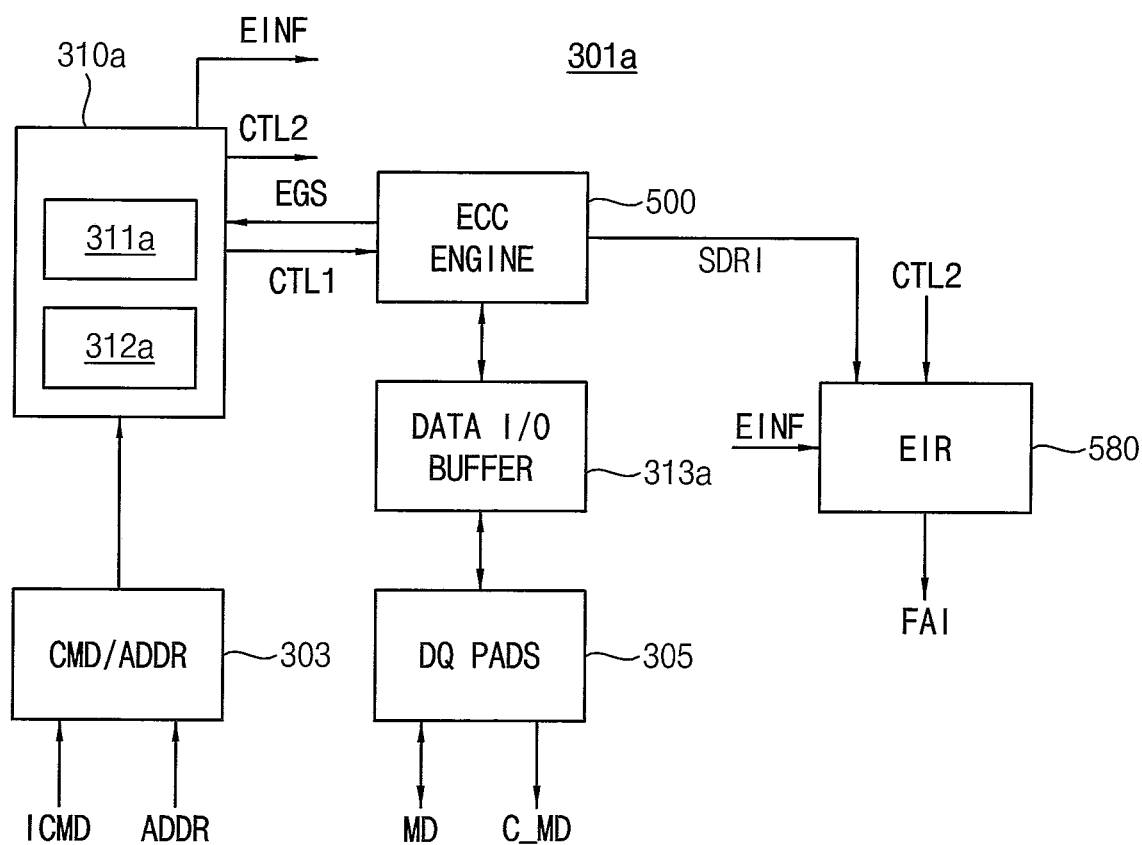
FIG. 12 illustrates an example of a peripheral circuit in the memory die of FIG. 9 according to exemplary embodiments of the inventive concept.

FIG. 12 illustrates an example of the peripheral circuit in the memory die of FIG. 9 according to exemplary embodiments.

Referring to FIG. 12, the peripheral circuit 301a may include a control logic circuit 310a, an ECC engine 500, a data I/O buffer 313a, an error information register 580, command/address pads 303 and input/output pads 305. The control logic circuit 310a may include a command decoder 311a and a mode register 312a.

The command/address pads 303 may receive the internal command ICMD and the address ADDR and may provide the internal command ICMD and the address ADDR to the control logic circuit 310a. The command decoder 311a may decode the internal command ICMD and the mode register 312a may set an operation mode of the memory die 300a. The control logic circuit 310a may generate a first control signal CTL1 to control the ECC engine 500 and a second control signal CTL2 to control the error information register 580 by decoding the internal command ICMD.

The input/output pads 305 may provide the main data MD to the ECC engine 500 through data I/O buffer 313. The ECC engine 500 may perform an ECC decoding on data corresponding to a first codeword from the memory cell array 400a, may provide an error generation signal EGS to the control logic circuit 310a in response to detecting an error in the data, and may provide the error information register 580 with syndrome information SDRI associated with detecting the error.

The control logic circuit 310a may provide the error information register 580 with a first address of a first memory location associated with the detected error as error information EINF based on the error generation signal EGS.

The error information register 580 may store the first address associated with the detected error and the syndrome information SDRI.

The control logic circuit 310a may determine an error attribute of the first codeword based on a change of a first syndrome associated with the first codeword, recorded in the error information register 580, based on multiple read-modify-write operations (e.g., memory access operations). When the control logic circuit 310a determines the error attribute of the first codeword (e.g., the first memory location) as a hard fault or a progressive fault, the control logic circuit 310a controls the error information register 580 such that the first address of the first memory location is provided to the interface circuit 230 as the fail address information FAI. In addition, the control logic circuit 310a controls the ECC engine 500 such that the ECC engine 500 provides the interface circuit 230 with the corrected data C_MD which is read from the first memory location and is corrected.

Figure 13:
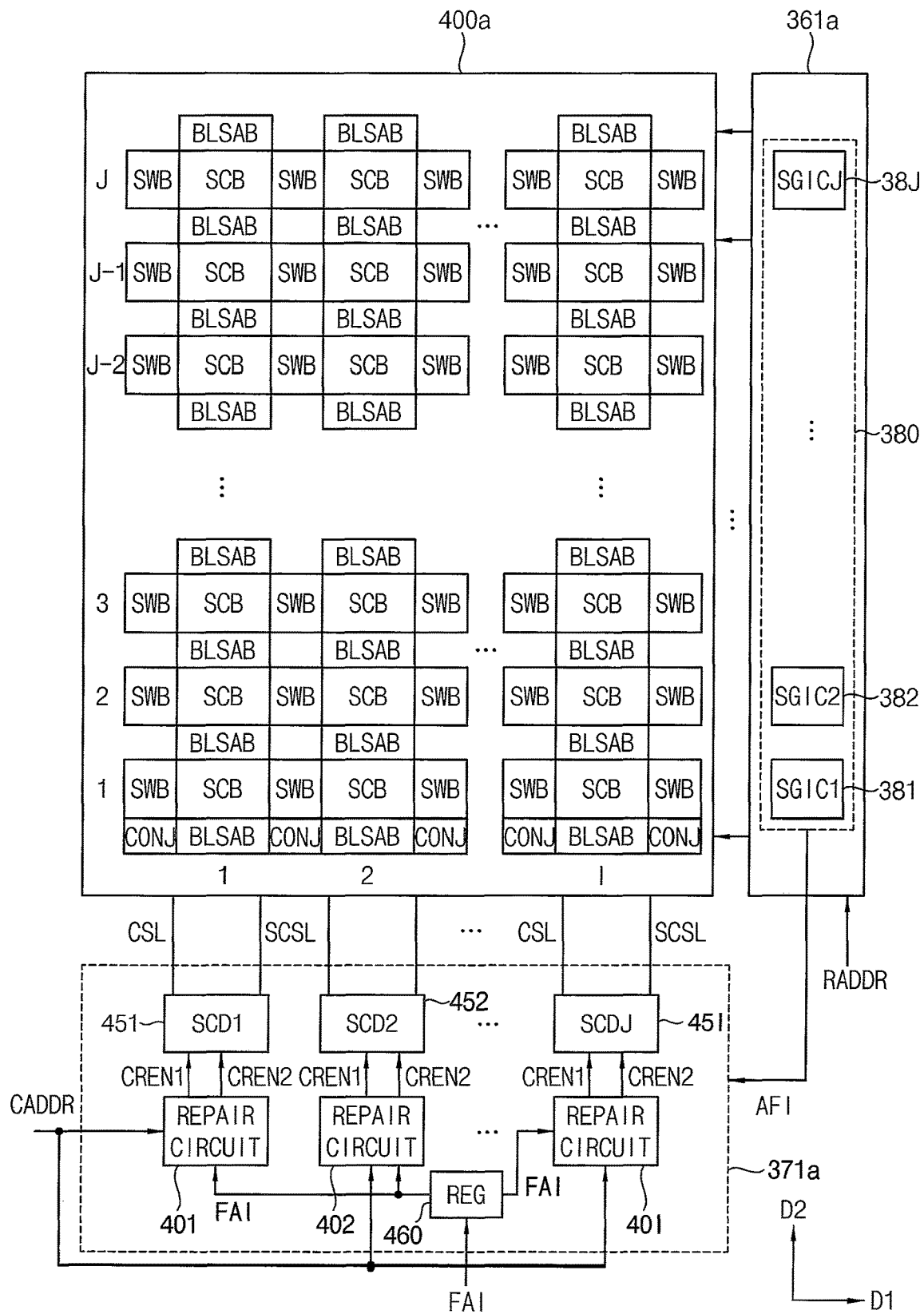
FIG. 13 illustrates a memory cell array, a row decoder and a column decoder in the memory die of FIG. 9 according to exemplary embodiments of the inventive concept.

FIG. 13 illustrates the memory cell array, the row decoder and the column decoder in the memory die of FIG. 9 according to exemplary embodiments of the inventive concept.

Referring to FIG. 13, in the memory cell array 400a, I sub-array blocks SCB may be disposed in the first direction D1, and J sub-array blocks SCB may be disposed in the second direction D2 substantially perpendicular to the first direction D1. I sub-array blocks SCB disposed in the first direction D1, and J sub-array blocks SCB disposed in the first direction D1 in one row may be referred to as a row block. A plurality of bit-lines, a plurality of word-lines, and a plurality of memory cells may be disposed in each of the sub-array blocks SCB.

I+1 sub word-line driver regions SWB may be disposed between the sub-array blocks SCB in the first direction D1. Each sub-array block SCB may correspond to a segment of each of the memory blocks. Sub word-line drivers may be disposed in the sub word-line driver regions SWB. J+1 bit-line sense amplifier regions BLSAB may be disposed, for example, between the sub-array blocks SCB in the second direction D2. Bit-line sense amplifiers to sense data stored in the memory cells may be disposed in the bit-line sense amplifier regions BLSAB.

A plurality of conjunction regions CONJ may be disposed adjacent the sub word-line driver regions SWB and the bit-line sense amplifier regions BLSAB.

The row decoder 361a includes the segment information generation circuit 380, and the segment information generation circuit 380 may include a plurality of segment information circuits 381~38J corresponding to the segments in the second direction D2, etc. The segment information circuits 381~38J may output anti-fuse information AFI to the column decoder 371a in response to the row address RADDR.

The column decoder 371a may include a plurality of sub column decoders SCDJ 451~45I, a plurality of repair circuits 401~40I and a register 460. The register 460 may store the fail address information FAI provided from the error information register 580 in FIG. 12. The register 460 may be connected to the plurality of repair circuits 401~40I. A soft PPR may be performed on the defective memory region by the register 460 storing the fail address information FAI during operation of the memory die 300a.

Each of the sub column decoders 451~45I may be connected to a corresponding memory block of the plurality memory blocks and the plurality of repair circuits 401~40I may correspond to the plurality of sub column decoders 451~45I. Each of the repair circuits 401~40I may selectively activate a first repair signal CREN1 or a second repair signal CREN2 in response to the column address CADDR, the anti-fuse information AFI and the fail address information FAI stored in the register 460 and provide the first repair signal CREN1 and/or the second repair signal CREN2 to a corresponding one of the sub column decoders 451~45I.

Each of the sub column decoders 451~45I may select one of the column selection line CSL and the spare column selection line SCSL in response to the first repair signal CERN1 and may unselect the column selection line CSL and the spare column selection line SCSL in response to the second repair signal CERN2.

For example, each of the sub column decoders 451~45I may select the column selection line CSL in response to the first repair signal CERN1 being deactivated. Each of the sub column decoders 451~45I may select the spare column selection line SCSL in response to the first repair signal CERN1 being activated. Each of the sub column decoders 451~45I may unselect the column selection line CSL and the spare column selection line SCSL in response to the second repair signal CERN2 being activated. In other words, each of the sub column decoders 451~45I may disable the column selection line CSL and the spare column selection line SCSL in response to the second repair signal CERN2 being activated.

Figure 14:
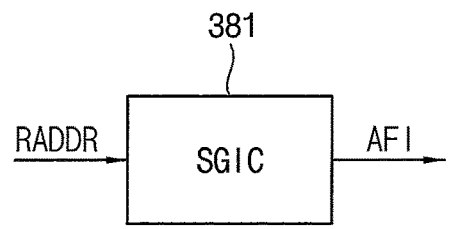
FIG. 14 is a block diagram illustrating a first segment information circuit of segment information circuits in FIG. 13 according to exemplary embodiments of the inventive concept.

FIG. 14 is a block diagram illustrating a first segment information circuit of the segment information circuits in FIG. 13 according to exemplary embodiments of the inventive concept.

Referring to FIG. 14, the first segment information circuit 381 may store the anti-fuse information AFI associated with repair of a corresponding segment and may provide the column decoder 371a with the anti-fuse information AFI indicating whether a spare bit-line in the corresponding segment is used or not. The segment information circuit 381 may be implemented with a fuse circuit.

Figure 15:
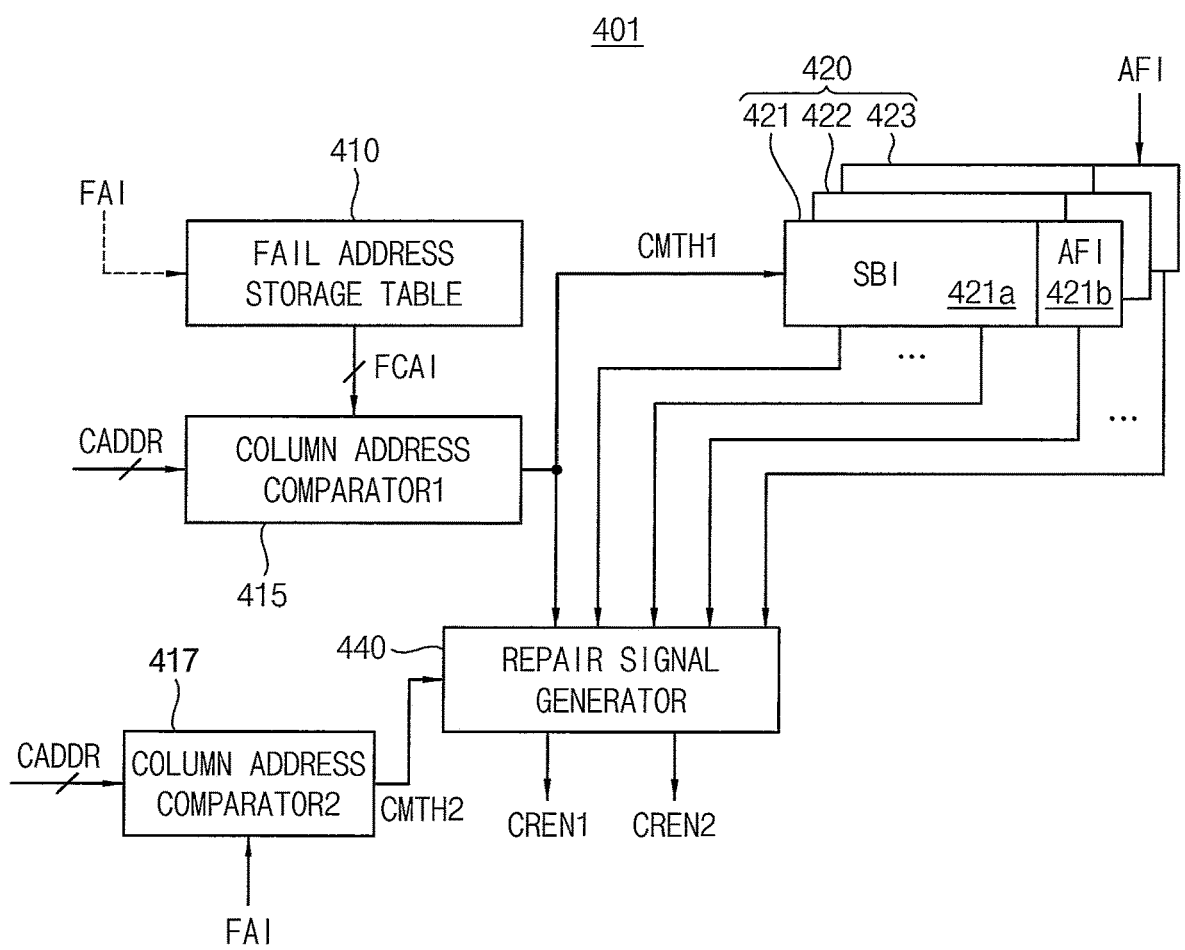
FIG. 15 is a block diagram illustrating a first repair circuit of repair circuits in FIG. 13 according to exemplary embodiments of the inventive concept.

FIG. 15 is a block diagram illustrating a first repair circuit of the repair circuits in FIG. 13 according to exemplary embodiments of the inventive concept.

Each configuration of the repair circuits 401~40I may be substantially the same as a configuration of the first repair circuit 401, but the inventive concept is not limited thereto.

Referring to FIG. 15, the first repair circuit 401 includes a fail address storage table 410, a first column address comparator 415, a second column address comparator 417, a fuse information storage circuit 420, and a repair signal generator 440.

The fail address storage table 410 may store fail column address information FCAI associated with column address information of defective cells of a corresponding memory block. The first column address comparator 415 may compare the column address CADDR with the fail column address information FCAI to output a first column match signal CMTH1 to the fuse information storage circuit 420 and the repair signal generator 440. The first column match signal CMTH1 may indicate whether the column address CADDR matches the fail column address information FCAI, or not. The fail address storage table 410 may be implemented with an anti-fuse array including anti-fuses.

The second column address comparator 417 may compare the column address CADDR with the fail address information FAI to output a second column match signal CMTH2 to the repair signal generator 440. The second column match signal CMTH2 may indicate whether the column address CADDR matches a column address of the fail address information FAI of the first memory location, or not, which is determined as a hard fault or a progressive fault.

The fuse information storage circuit 420 includes a plurality of unit sets 421, 422 and 423, etc. Each of the unit sets 421, 422 and 423 may include a first region 421a and a second region 421b, but is not limited thereto. The first region 421a may store a spare bit-line information SBI on a spare bit-line to repair a defective cells in each of the segments in the corresponding memory block and the second region 421b may store the anti-fuse information AFI associated with a usability of a spare bit-line of the corresponding segment (e.g., the usability of a spare bit-line in a different segment).

The fuse information storage circuit 420 may store the spare bit-line information SBI and the anti-fuse information AFI. The fuse information storage circuit 420 may provide the spare bit-line information SBI and the anti-fuse information AFI to the repair signal generator 440 in response to the first column match signal CMTH1.

The repair signal generator 440 may determine logic levels of the first repair signal CREN1 and the second repair signal CREN2 based on the first column match signal CMTH1, the second column match signal CMTH2, the spare bit-line information SBI, and/or the anti-fuse information AFI.

For example, when the first column match signal CMTH1 indicates the column address CADDR does not match the fail column address information FCAI, the repair signal generator 440 deactivates the first repair signal CREN1. In this case, the first sub column decoder 451 in FIG. 13 selects the column selection line CSL.

For example, when the first column match signal CMTH1 indicates the column address CADDR matches the fail column address information FCAI and the anti-fuse information AFI indicates that a spare bit-line in a corresponding segment is usable, the repair signal generator 440 activates the first repair signal CREN1 with a high level (e.g., a high signal, a high voltage level, etc.). In this case, the first sub column decoder 451 in FIG. 13 selects the spare column selection line SCSL.

For example, when the second column match signal CMTH2 indicates the column address CADDR matches the column address of the fail address information FAI, the repair signal generator 440 activates the second repair signal CREN2 with a high level. In this case, the first sub column decoder 451 in FIG. 13 unselects the column select line CSL and the spare column selection line SCSL to cut off access to the memory cell array 400a.

In an exemplary embodiment of the inventive concept, the control logic circuit 310a may program the fail address information FAI stored in the register 460 in the fail address storage table 410 during an idle time of the stacked memory device 70a. The control logic circuit 310a may perform a hard PPR in the defective memory region by programming the fail address information FAI in the fail address storage table 410.

FIG. 16 is an example of the error information register in the peripheral circuit in FIG. 12 according to exemplary embodiments of the inventive concept.

Referring to FIG. 16, each of indexes (e.g., entries) Idx21, Indx22, . . . , Idx2u (u is a natural number greater than two) of the error information register 580 may include fail address information FAI_CID1 of the first memory die and corresponding syndrome information SDRI. The indexes (e.g., entries) Idx21, Indx22, . . . , Idx2u of the error information register 580 may store an error attribute ATT of the defective memory regions based on changes of corresponding syndromes. The error information register 580 includes a first column 581, a second column 582 and a third column 583.

The first column 581 may store fail address information BA/RA/CA_11, BA/RA/CA_12, . . . , BA/RA/CA_1u of the defective memory regions. The second column 582 may store syndromes SDR1, SDR2, . . . , SDRu of the codewords read from the defective memory regions. The third column 583 may store error attributes ATTa, ATTb, . . . , ATTc of the defective memory regions based on change of the syndromes (e.g., values of the syndrome).

The error attribute ATTa may represent a soft fault, the error attribute ATTb may represent a hard fault and the error attribute ATTc may represent a progressive fault. The hard fault may refer to a case where a memory cell's hardware is damaged. The soft fault may refer to a case where a memory cell's hardware is not damaged, but data of the memory cell temporarily transitions due to alpha particles and so on. The progressive fault may refer to a case where a memory cell is progressing from the soft fault to the hard fault. In other words, the progressive fault may indicate that the soft fault is likely going to become a hard fault.

The control logic circuit 310a may determine an error attribute of each of the defective memory regions based on a change of syndromes associated with the codeword read from the each of the defective memory regions, recorded in the error information register 580, based on multiple read-modify-write operations (memory access operations). When the control logic circuit 310a determines the error attribute as a hard fault or a progressive fault, the control logic circuit 310a controls the error information register 580 and the ECC engine 500 such that fail address information of the defective memory region and associated corrected data are stored in the storage memory (e.g., SRAM 260) in the interface circuit 230.

Figure 17:
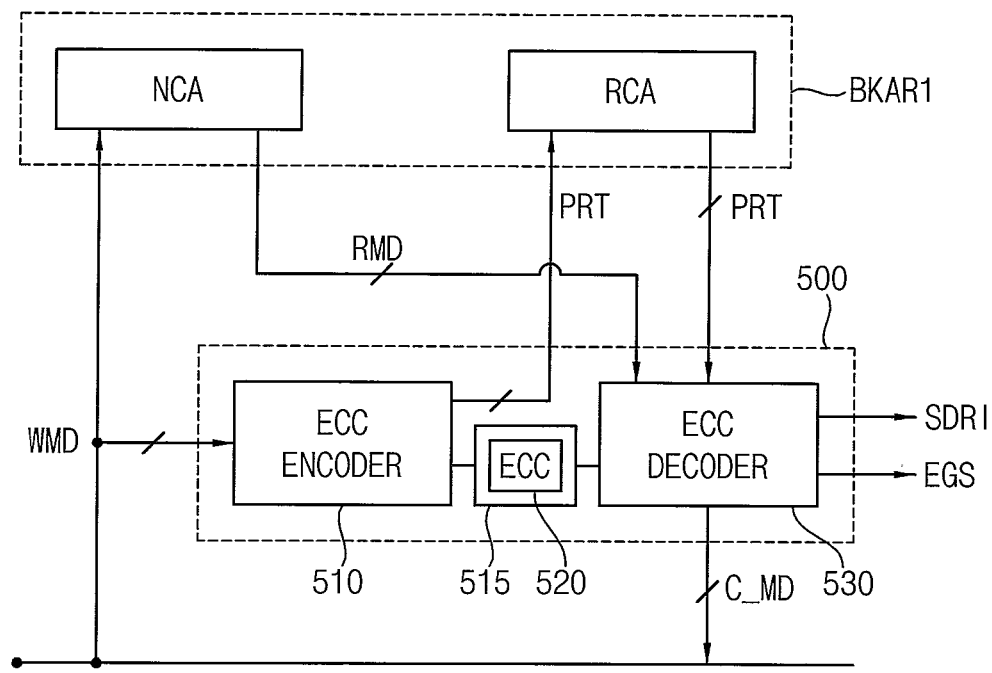
FIG. 17 is a block diagram illustrating an example of an error correction code (ECC) engine in the memory die of FIG. 9 according to exemplary embodiments of the inventive concept.

FIG. 17 is a block diagram illustrating an example of the ECC engine in the memory die of FIG. 9 according to exemplary embodiments of the inventive concept.

Referring to FIG. 17, the ECC engine 500 may include an ECC encoder 510, an ECC decoder 530 and a (ECC) memory 515. The memory 515 may store an ECC 520. The ECC 520 may be a single error correction (SEC) code or a single error correction/double error detection (SECDED) code, but is not limited thereto.

The ECC encoder 510 may generate parity data PRT using the ECC 520, associated with a write data WMD to be stored in the normal cell array NCA of a first bank array BKAR1. The parity data PRT may be stored in the redundancy cell array RCA of the first bank array BKAR1.

The ECC decoder 530 may perform an ECC decoding on a read data RMD based on the read data RMD and the parity data PRT read from the first bank array BKAR1 using the ECC 520. When the read data RMD includes at least one error (bit) as a result of the ECC decoding, the ECC decoder 530 provides the error generation signal EGS to the control logic circuit 310a. In addition, the ECC decoder 530 may provide the error information register 580 with the syndrome information SDRI associated with the at least one error, and may selectively correct the error bit in the read data RMD to output the corrected main data C_MD in a read operation.

Figure 18:
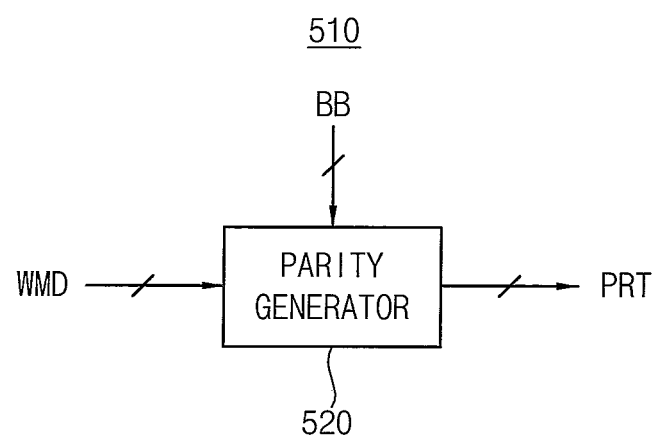
FIG. 18 illustrates an example of an ECC encoder in the ECC engine of FIG. 17 according to exemplary embodiments of the inventive concept.

FIG. 18 illustrates an example of the ECC encoder in the ECC engine of FIG. 17 according to exemplary embodiments of the inventive concept.

Referring to FIG. 18, the ECC encoder 510 may include a parity generator 520. The parity generator 520 receives write data WMD and a basis bit BB and generates the parity data PRT by performing, for example, an XOR array operation.

Figure 19:
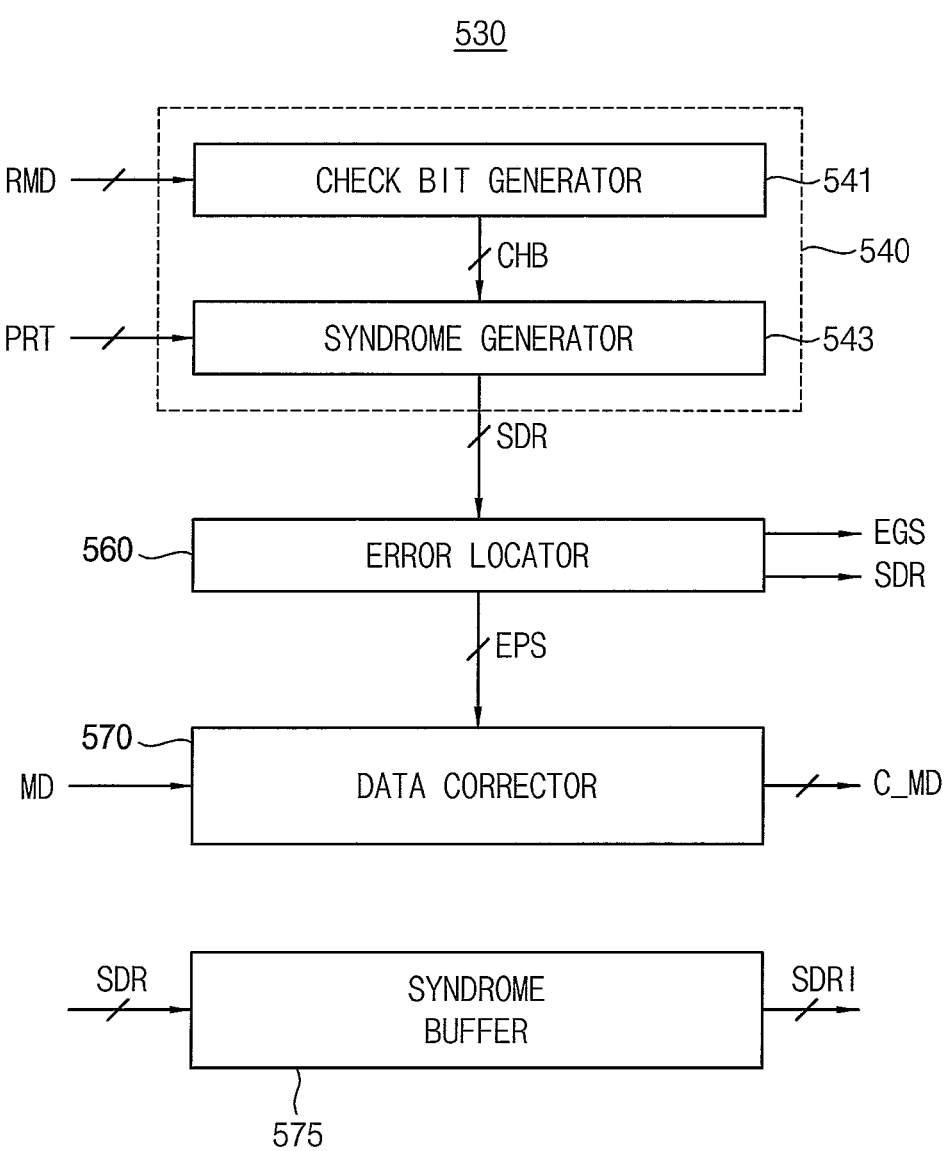
FIG. 19 illustrates an example of an ECC decoder in the ECC engine of FIG. 17 according to exemplary embodiments of the inventive concept.

FIG. 19 illustrates an example of the ECC decoder in the ECC engine of FIG. 17 according to exemplary embodiments of the inventive concept.

Referring to FIG. 19, the ECC decoder 530 may include a syndrome generation circuit 540, an error locator 560, a data corrector 570, and a syndrome buffer 575. The syndrome generation circuit 540 may include a check bit generator 541 and a syndrome generator 543.

The check bit generator 541 generates check bits CHB based on the read data RMD by performing, an XOR array operation and the syndrome generator 543 generates a syndrome SDR by comparing corresponding bits of the parity data PRT and the check bits CHB.

The error locator 560 generates an error positon signal EPS indicating a position of an error bit in the read data RMD and provides the error positon signal EPS to the data corrector 570 when all bits of the syndrome SDR are not 'zero'. In addition, when the read data RMD includes the error bit, the error locator 560 provides the error generation signal EGS to the control logic circuit 310a and provides the syndrome SDR to the syndrome buffer 575.

The syndrome buffer 575 stores the syndrome SDR and provides the stored syndrome SDR to the error information register 580. In other words, the syndrome buffer 575 provides the stored syndrome SDR as syndrome information SDRI to the error information register 580.

The data corrector 570 receives the read data RMD, corrects the error bit in the read data RMD based on the error position signal EPS when the read data RMD includes the error bit and outputs the corrected main data C_MD.

Figure 20:
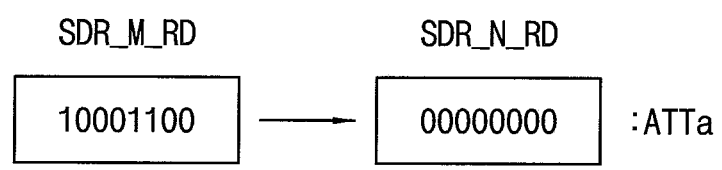
FIGS. 20, 21 and 22 illustrate that a control logic circuit determines an error attribute based on a change of values of a syndrome according to exemplary embodiments of the inventive concept, respectively.
Figure 21:
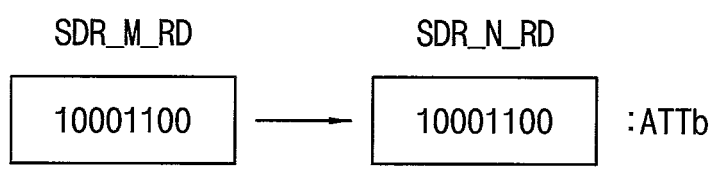
Figure 22:
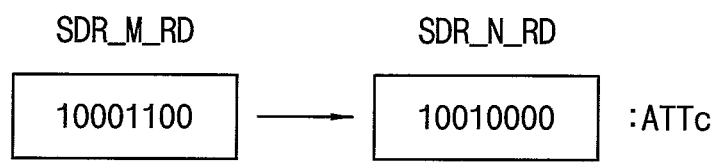

FIGS. 20 through 22 illustrate that the control logic circuit determines an error attribute based on a change of values of the syndrome according to exemplary embodiments of the inventive concept, respectively.

In FIGS. 20 through 22, SDR_M_RD denotes a syndrome obtained by M-th ECC decoding on a first memory location and SDR_N_RD denotes a syndrome obtained by N-th ECC decoding on the first memory location. Here, M is an integer greater than one and N is an integer greater than M.

Referring to FIG. 20, when an M-th value of the syndrome SDR_M_RD obtained by M-th ECC decoding is '10001100' which is non-zero and an N-th value of the syndrome SDR_N_RD obtained by N-th ECC decoding is '00000000' which is zero, the control logic circuit 310a determines the error attribute as the first error attribute ATTa corresponding to the soft fault.

Referring to FIG. 21, when the M-th value of the syndrome SDR_M_RD obtained by the M-th ECC decoding is '10001100' which is non-zero, and the N-th value of the syndrome SDR_N_RD obtained by the N-th ECC decoding is '10001100' which is non-zero, the M-th value is the same as the N-th value. Thus, the control logic circuit 310a determines the error attribute as the second error attribute ATTb corresponding to the hard fault.

Referring to FIG. 22, when the M-th value of the syndrome SDR_M_RD obtained by the M-th ECC decoding is '10001100' which is non-zero, and the N-th value of the syndrome SDR_N_RD obtained by the N-th ECC decoding is '10010000' which is non-zero, the M-th value is different from the N-th value. Thus, the control logic circuit 310a determines the error attribute as the third error attribute ATTc corresponding to progressive fault.

When the error attribute based on the change of the value of the syndrome corresponds to a hard fault or a progressive fault, the control logic circuit 310a may store associated fail address information and corrected data in the SRAM 260. When the error attribute based on the change of the value of the syndrome corresponds to a soft fault, the control logic circuit 310a may control the ECC engine 500 to correct the error instead of storing associated fail address information and corrected data in the SRAM 260.

Figure 23:
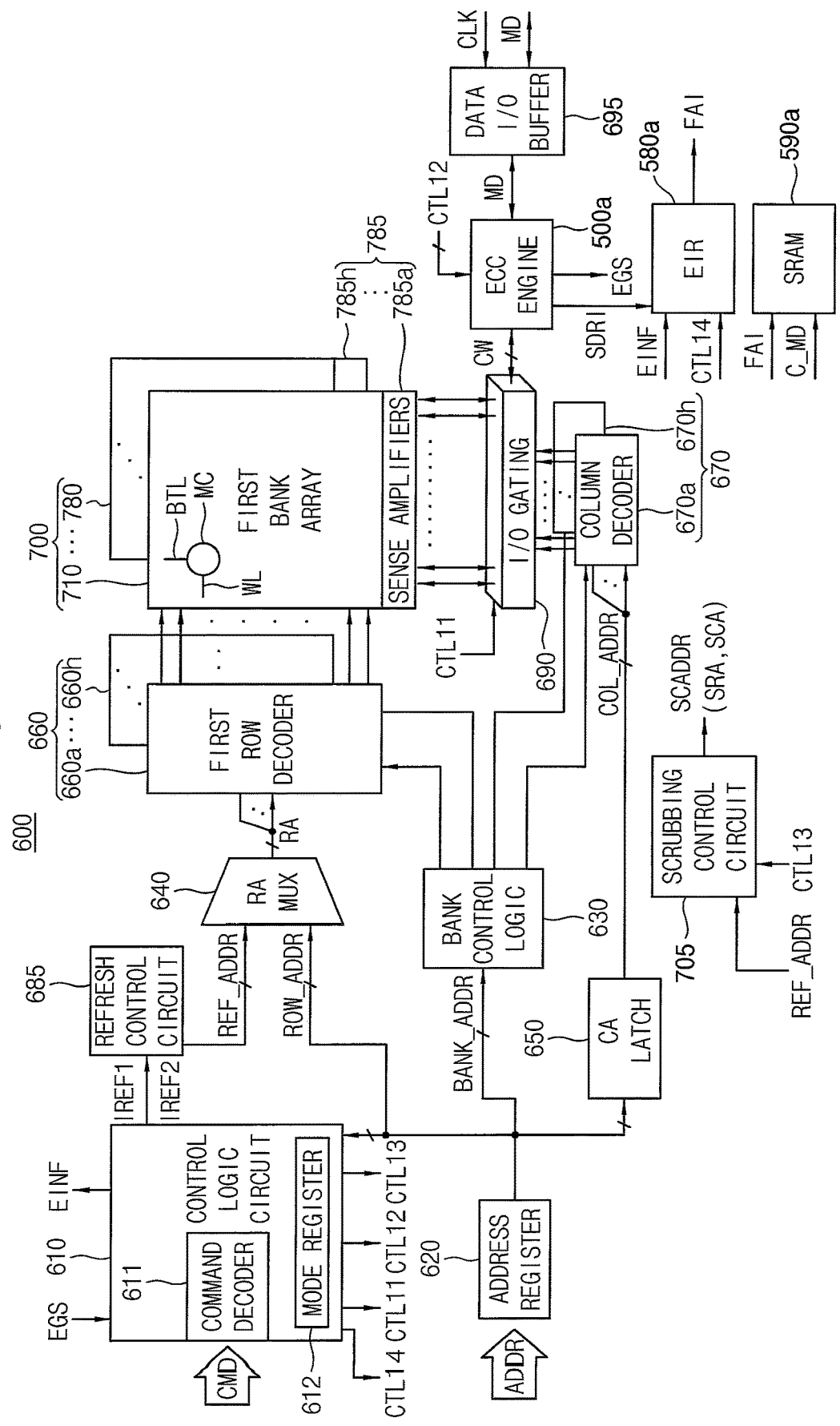
FIG. 23 is a block diagram illustrating an example of a semiconductor memory device in the memory system of FIG. 1 according to exemplary embodiments of the inventive concept.

FIG. 23 is a block diagram illustrating an example of the semiconductor memory device in the memory system of FIG. 1 according to exemplary embodiments of the inventive concept.

Referring to FIG. 23, a semiconductor memory device 600 includes the control logic circuit 610, an address register 620, a bank control logic 630, a refresh control circuit 685, a row address multiplexer 640, a column address latch 650, a row decoder 660, a column decoder 670, a memory cell array 700, a sense amplifier unit 785, an I/O gating circuit 690, an ECC engine 500a, a scrubbing control circuit 705, a data I/O buffer 695, an error information register 580a and an SRAM 590a.

The memory cell array 700 includes first through eighth bank arrays 710~780. The row decoder 660 includes first through eighth row decoders 660a~660h respectively coupled to the first through eighth bank arrays 710~780, the column decoder 670 includes first through eighth column decoders 670a~670h respectively coupled to the first through eighth bank arrays 710~780, and the sense amplifier unit 785 includes first through eighth sense amplifiers 785a~785h respectively coupled to the first through eighth bank arrays 710~780.

The first through eighth bank arrays 710~780, the first through eighth row decoders 660a~660h, the first through eighth column decoders 670a~670h and first through eighth sense amplifiers 785a~785h may form first through eighth banks. Each of the first through eighth bank arrays 710~780 includes a plurality of memory cells MC formed at intersections of a plurality of word-lines WL and a plurality of bit-lines BTL.

The address register 620 receives the address ADDR including a bank address BANK_ADDR, a row address ROW_ADDR and a column address COL_ADDR from the memory controller 20. The address register 620 provides the received bank address BANK_ADDR to the bank control logic 630, provides the received row address ROW_ADDR to the row address multiplexer 640, and provides the received column address COL_ADDR to the column address latch 650.

The bank control logic 630 generates bank control signals in response to the bank address BANK_ADDR. One of the first through eighth row decoders 660a~660h corresponding to the bank address BANK_ADDR is activated in response to the bank control signals, and one of the first through eighth column decoders 670a~670h corresponding to the bank address BANK_ADDR is activated in response to the bank control signals.

The row address multiplexer 640 receives the row address ROW_ADDR from the address register 620, and receives a refresh row address REF_ADDR from the refresh control circuit 685. The row address multiplexer 640 selectively outputs the row address ROW_ADDR or the refresh row address REF_ADDR as a row address RA. The row address RA that is output from the row address multiplexer 640 is applied to the first through eighth row decoders 660a~660h.

The refresh control circuit 685 may sequentially output the refresh row address REF_ADDR in response to a first refresh control signal IREF1 or a second refresh control signal IREF2 provided from the control logic circuit 610.

When the command CMD from the memory controller 20 corresponds to an auto refresh command, the control logic circuit 610 may apply the first refresh control signal IREF1 to the refresh control circuit 685 whenever the control logic circuit 610 receives the auto refresh command.

When the command CMD from the memory controller 20 corresponds to a self-refresh entry command, the control logic circuit 610 may apply the second refresh control signal IREF2 to the refresh control circuit 685. The second refresh control signal IREF2 is activated from a time point when the control logic circuit 610 receives the self-refresh entry command to a time point when control logic circuit 610 receives a self-refresh exit command. The refresh control circuit 685 may sequentially increase or decrease the refresh row address REF_ADDR in response to receiving the first refresh control signal IREF1 or when the second refresh control signal IREF2 is activated.

The activated one of the first through eighth row decoders 660a~660h, by the bank control logic 630, decodes the row address RA that is output from the row address multiplexer 640, and activates a word-line corresponding to the row address RA. For example, the activated bank row decoder applies a word-line driving voltage to the word-line corresponding to the row address RA.

The column address latch 650 receives the column address COL_ADDR from the address register 620, and temporarily stores the received column address COL_ADDR. In exemplary embodiments of the inventive concept, in a burst mode, the column address latch 650 generates column addresses that increment from the received column address COL_ADDR. The column address latch 650 applies the temporarily stored or generated column address to the first through eighth column decoders 670a~670h.

The activated one of the first through eighth column decoders 670a~670h activates a sense amplifier corresponding to the bank address BANK_ADDR and the column address COL_ADDR through the I/O gating circuit 690.

The I/O gating circuit 690 includes circuitry for gating input/output data, and further includes input data mask logic, read data latches for storing data that is output from the first through eighth bank arrays 710~780, and write drivers for writing data to the first through eighth bank arrays 710~780.

A codeword CW read from one bank array of the first through eighth bank arrays 710~780 is sensed by a sense amplifier coupled to the one bank array from which the data is to be read, and is stored in the read data latches. The codeword CW stored in the read data latches may be provided to the memory controller 20 via the data I/O buffer 695 after ECC decoding is performed on the codeword CW by the ECC engine 500a.

The main data MD to be written in one bank array of the first through eighth bank arrays 710~780 may be provided to the data I/O buffer 695 from the memory controller 20, and may be provided to the ECC engine 500a from the data I/O buffer 695. In this case, the ECC engine 500a may perform an ECC encoding on the main data MD to generate parity data, the ECC engine 500a may provide the main data MD and the parity data to the I/O gating circuit 690 and the I/O gating circuit 690 may write the main data MD and the parity data in a sub-page of the target page in one bank array through the write drivers.

The data I/O buffer 695 may provide the main data MD from the memory controller 20 to the ECC engine 500a in a write operation of the semiconductor memory device 600, based on a clock signal CLK and may provide the main data MD from the ECC engine 500a to the memory controller 20 in a read operation of the semiconductor memory device 600.

The ECC engine 500a may perform an operation similar to an operation of the ECC engine 500 in FIG. 12. The ECC engine 500a performs an ECC decoding on a codeword CW read from a sub-page, provides the control logic circuit 610 with the error generation signal EGS in response to detecting an error based on the ECC decoding, and provides the error information register 580a with the syndrome information SDRI associated with the detected error.

The scrubbing control circuit 705 may count the refresh row address REF_ADDR which sequentially changes and may output a normal scrubbing address SCADDR whenever the scrubbing control circuit 705 counts K refresh row addresses. Here, K is an integer greater than two. The normal scrubbing address SCADDR may include a scrubbing row address SRA and a scrubbing column address SCA. The scrubbing control circuit 705 may provide the scrubbing row address SRA and the scrubbing column address SCA to the row decoder 660 and the column decoder 670.

The control logic circuit 610 may control operations of the semiconductor memory device 600. The control logic circuit 610 includes a command decoder 611 that decodes the command CMD received from the memory controller 20 and a mode register 612 that sets an operation mode of the semiconductor memory device 600.

For example, the command decoder 611 may generate the control signals corresponding to the command CMD by decoding a write enable signal, a row address strobe signal, a column address strobe signal, a chip select signal, etc.

The control logic circuit 610 may generate a first control signal CTL11 to control the I/O gating circuit 690, a second control signal CTL12 to control the ECC engine 500a, a third control signal CTL13 to control the scrubbing control circuit 705 and a fourth control signal CTL14 to control the error information register 580a.

The error information register 580a stores error information EINF provided from the control logic circuit 610, provides fail address information FAI to the SRAM 590a and stores the syndrome information SDRI.

The control logic circuit 610 may determine an error attribute of each of the defective memory regions based on change of syndromes, recorded in the error information register 580a, based on multiple read-modify-write operations (memory access operations). When the control logic circuit 610 determines the error attribute as a hard fault or a progressive fault, the control logic circuit 610 controls the error information register 580a and the ECC engine 500a such that fail address information FAI of the defective memory region and associated corrected data C_MD are stored in the SRAM 590a.

The SRAM 590a may store the fail address information FAI and associated the corrected data C_MD.

When a second address from the memory controller 20 matches the fail address information FAI, the control logic circuit 610 controls the SRAM 590a such that data associated with the second address may be input/output via the SRAM 590a. To accomplish this operation, each of the first through eighth column decoders 670a~670h may include the first column address comparator 415 and the second column address comparator 417 in FIG. 15.

When each of the memory dies 300a~300k employs the semiconductor memory device 600 of FIG. 23, the SRAM 590a may be included in the buffer die 200 instead of being included in each of the memory dies 300a~300k.

Figure 24:
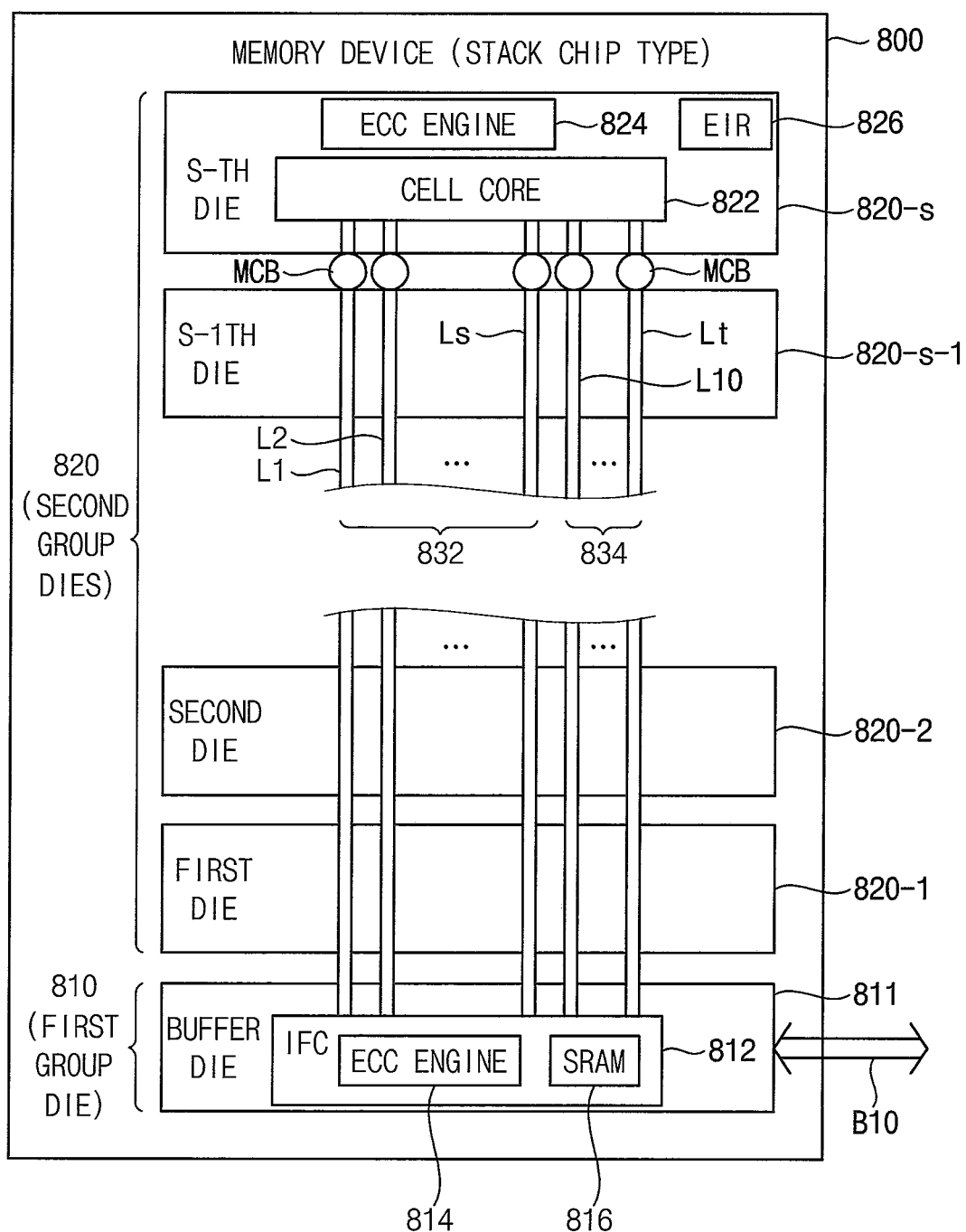
FIG. 24 is a block diagram illustrating a semiconductor memory device according to exemplary embodiments of the inventive concept.

FIG. 24 is a block diagram illustrating a semiconductor memory device according to exemplary embodiments of the inventive concept.

Referring to FIG. 24, a semiconductor memory device 800 may include a first group of dies 810 and a second group of dies 820 providing a stacked chip structure.

The first group of dies 810 may include at least one buffer die 811. In other words, the first group of dies 810 may include just one die. The second group of dies 820 may include a plurality of memory dies 820-1 to 820-s which is stacked on the at least one buffer die 811 and convey data through a plurality of through substrate vias (or, through silicon via (TSV)) lines. Here, s is an integer greater than two.

Each of the memory dies 820-1 to 820-s may include a cell core 822 to store data and parity, an ECC engine 824, an error information register 826 and a control logic circuit. Each of the control logic circuit, the ECC engine 824 and the error information register 826 may perform substantially the same operation that of a respective one of the control logic circuit 310a, the ECC engine 500 and the error information register 580 in FIG. 12.

The buffer die 811 may include an interface circuit 812 and the interface circuit 812 may include an ECC engine 814 and an SRAM 816. The interface circuit 812 may employ the interface circuit 230 in FIG. 7. The ECC engine 814 may be referred to as a via ECC engine and may correct a transmission error provided from at least one of the memory dies 820-1 to 820-s.

A data TSV line group 832 which is formed at one memory die 820-s may include a plurality of TSV lines L1 to Lt, and a parity TSV line group 834 may include a plurality of TSV lines L10 to Lt. The TSV lines L1 to Ls of the data TSV line group 832 and the parity TSV lines L10 to Lt of the parity TSV line group 834 may be connected to micro bumps MCB which are correspondingly formed among the memory dies 820-1 to 820-s.

At least one of the memory dies 820-1 to 820-s may include DRAM cells each including at least one access transistor and one storage capacitor. The semiconductor memory device 800 may have a three-dimensional (3D) chip structure or a 2.5D chip structure to communicate with the host through a data bus B10. The buffer die 811 may be connected with the memory controller through the data bus B10.

Figure 25:
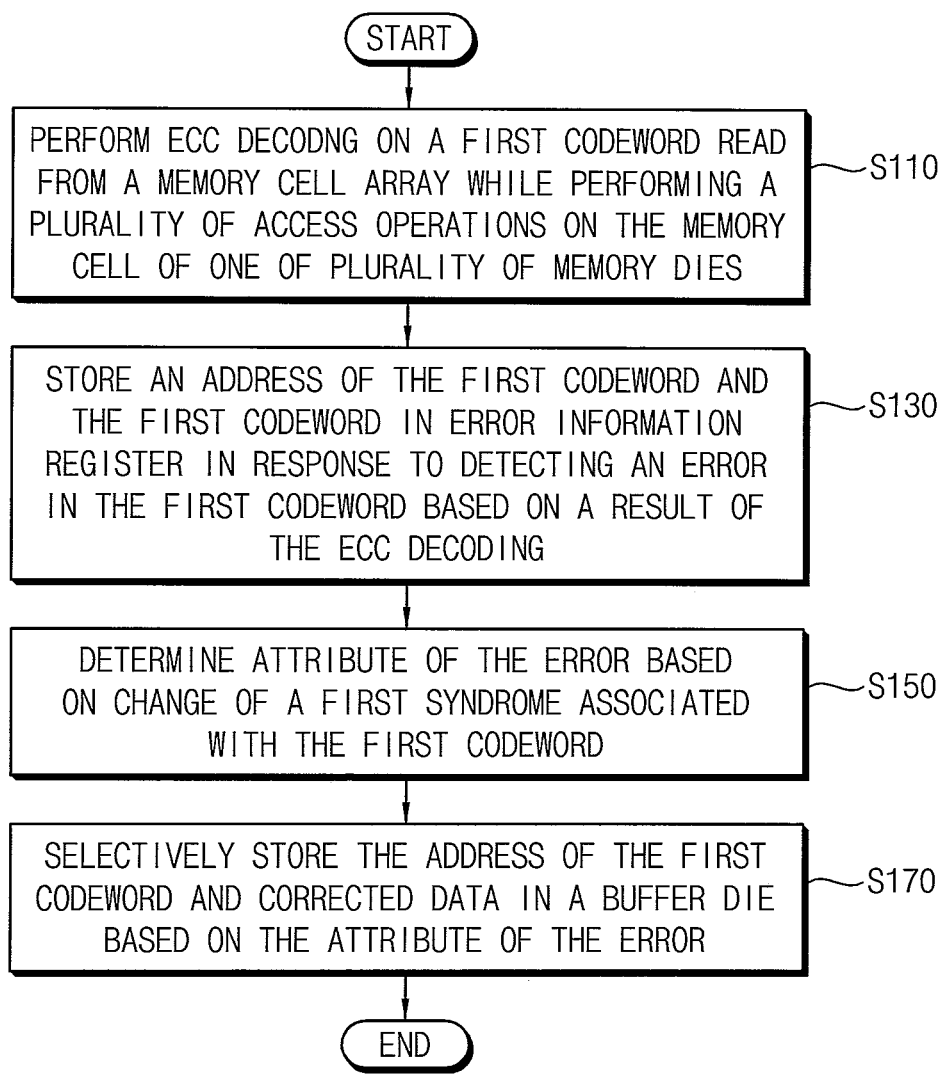
FIG. 25 is a flow chart illustrating a method of operating a semiconductor memory device of the inventive concept.

FIG. 25 is a flow chart illustrating a method of operating a semiconductor memory device according to an exemplary embodiment of the inventive concept.

Referring to FIGS. 5 through 25, there is provided a method of operating a semiconductor memory device which includes a buffer die 200 and a plurality of memory dies 300a~300k which are stacked on buffer die 200. The buffer die 200 and the memory dies 300a~300k may be sequentially stacked on each other. The memory dies 300a~300k are electrically connected to the buffer die 200 through TSVs 220. Each of the memory dies 300a~300k include a memory cell array, a control logic circuit, an ECC engine and an error information register.

According to the method, the ECC engine performs an ECC decoding on a first codeword read from a first sub-page in a memory cell array while performing multiple memory operations (e.g., access operations) on the memory cell array in a target memory die among the memory dies 300a~300k (operation S110).

The control logic circuit stores, in the error information register, a first address of the first codeword and the first codeword in response to detecting an error in the first codeword based on a result of the ECC decoding (operation S130).

The control logic circuit determines error attribute of a first memory location corresponding to the first sub-page based on a change of the syndrome associated with the first codeword (operation S150).

The control logic circuit selectively stores the first address and corrected data in an interface circuit in the buffer die based on the determined error attribute (operation S170).

When the control logic circuit determines the error attribute as a hard fault or a progressive fault, the control logic circuit may perform soft PPR in the first memory location by storing the first address and the corrected data in the interface circuit during operation of the semiconductor memory device.

Figure 26:
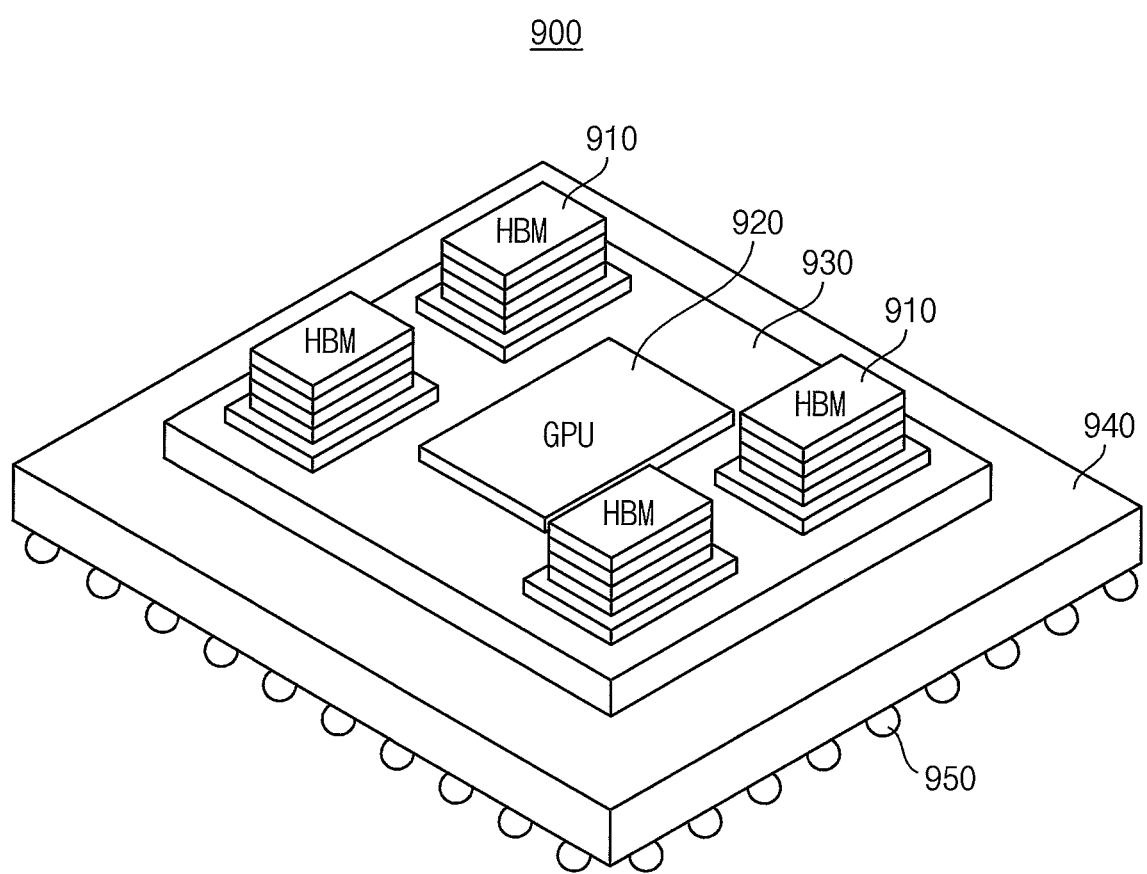
FIG. 26 is a diagram illustrating a semiconductor package including the stacked memory device according to exemplary embodiments of the inventive concept.

FIG. 26 is a diagram illustrating a semiconductor package including the stacked memory device according to exemplary embodiments of the inventive concept.

Referring to FIG. 26, a semiconductor package 900 may include one or more stacked memory devices 910 and a GPU 920.

The stacked memory devices 910 and the GPU 920 may be mounted on an interposer 930, and the interposer on which the stacked memory devices 910 and the GPU 920 are mounted may be mounted on a package substrate 940.

The GPU 920 may perform the same operation as the memory controller 20 in FIG. 2 or may be included in the memory controller 20. The GPU 920 may include a first ECC engine that uses a first ECC. The GPU 920 may store data, which is generated or used in graphic processing, in the stacked memory devices 910.

The stacked memory device 910 may be implemented in various forms, and the stacked memory device 910 may be a memory device in a high bandwidth memory (HBM) form in which a plurality of layers are stacked. Accordingly, the stacked memory device 910 may include a buffer die and a plurality of memory dies. The buffer die may include an interface circuit.

Each of the memory dies includes a memory cell array, a control logic circuit, an ECC engine and an error information register. Therefore, the control logic circuit may control the ECC engine to perform a read-modify write operation by reading data corresponding to a first codeword from a sub-page in a first memory cell row, perform an ECC decoding on the data to generate an error generation signal in response to detecting an error in the first codeword, correct the detected error in the first codeword, and write back a corrected first codeword in a first memory location corresponding to the first sub-page.

In addition, the control logic circuit may record, in the error information register, a first address associated with the first codeword based on the error generation signal and a first syndrome obtained by the ECC decoding, and may determine an error attribute of the first codeword based on a change of the first syndrome, recorded in the error information register, based on a plurality of read-modify-write operations. When the control logic circuit determines the error attribute as a hard fault or a progressive fault, the control logic circuit may perform a soft PPR by storing fail address information of the first memory location and associated corrected data in a storage memory in the interface circuit during operation of the stacked memory device 910.

The plurality of stacked memory devices 910 may be mounted on the interposer 930, and the GPU 920 may communicate with the plurality of stacked memory devices 910. For example, each of the stacked memory devices 910 and the GPU 920 may include a physical region, and communication may be performed between the stacked memory devices 910 and the GPU 920 through the physical regions.

Exemplary embodiments of the present inventive concept may be applied to various systems that employ semiconductor memory devices and stacked memory devices and thus a soft PPR may be performed on defective memory cells based on an error attribute while the semiconductor memory device operates.

While the inventive concept has been particularly shown and described with reference to exemplary embodiments thereof, it will be understood by one of ordinary skill in the art that variations in form and detail may be made thereto without departing from the spirit and scope of the inventive concept as set forth in the claims.

What is claimed is:

1. A semiconductor memory device, comprising:
a buffer die;
a plurality of memory dies stacked on the buffer die; and
a plurality of through silicon vias (TSVs) connecting the plurality of memory dies to the buffer die,
wherein at least one of the plurality of memory dies includes:
a memory cell array which includes a plurality of memory cell rows, each row including a plurality of volatile memory cells;
an error correction code (ECC) engine;
an error information register separate from the ECC engine; and
a control logic circuit configured to control the ECC engine to perform a read-modify-write operation by:
reading data corresponding to a first codeword from a sub-page in a first memory cell row among the plurality of memory cell rows based on an access address and a command;

performing an ECC decoding on the data to generate an error generation signal in response to detecting an error in the first codeword;
correcting the detected error in the first codeword; and
writing a corrected first codeword in a first memory location corresponding to the sub-page,
wherein the control logic circuit is configured to:
record, in the error information register, a first address associated with the first codeword based on the error generation signal and a first syndrome obtained by the ECC decoding;
determine an error attribute of the first codeword based on a change of the first syndrome associated with the same sub-page, recorded in the error information register, based on a plurality of read-modify-write operations; and
record the error attribute of the first codeword m the error information register.

2. The semiconductor memory device of claim 1, wherein the buffer die includes an interface circuit, connected to the TSVs, and including a storage memory, and
wherein the control logic circuit is configured to repair the first memory location based on the determined error attribute.

3. The semiconductor memory device of claim 2, wherein when the first syndrome obtained by the ECC decoding has non-zero values, the control logic circuit is configured to repair the first memory location by storing the first address and associated corrected data in the storage memory.

4. The semiconductor memory device of claim 2, wherein when the first syndrome obtained based on the plurality of read-modify-write operations has non-zero values and an M-th value of the first syndrome obtained by an M-th ECC decoding is the same as an N-th value of the first syndrome obtained by an N-th ECC decoding (M is an integer greater than one and N is an integer greater than M),
the control logic circuit is configured to:
determine the error attribute as a hard fault; and
repair the first memory location by storing the first address and associated corrected data in the storage memory.

5. The semiconductor memory device of claim 2, wherein when the first syndrome obtained based on the plurality of read-modify-write operations has non-zero values and an M-th value of the first syndrome obtained by an M-th ECC decoding is different from an N-th value of the first syndrome obtained by an N-th ECC decoding (M is an integer greater than one and N is an integer greater than M),
the control logic circuit is configured to:
determine the error attribute as a progressive fault; and
repair the first memory location by storing the first address and associated corrected data in the storage memory.

6. The semiconductor memory device of claim 2, wherein the control logic circuit is configured to repair the first memory cell row including the first memory location or a column associated with the first memory location based on the determined error attribute.

7. The semiconductor memory device of claim 2, wherein the storage memory is configured to store the first address designating the first memory location as a hard fault or a progressive fault, associated corrected data and a chip identifier of a corresponding memory die.

8. The semiconductor memory device of claim 7, wherein the interface circuit is configured to control the storage memory such that the corrected data stored in storage memory is input/output in response to a second address matching the first address after a repair on the first memory location is completed.

9. The semiconductor memory device of claim 1, wherein the control logic circuit is configured to control the error information register such that the first address associated with the first memory location is provided to a column decoder coupled to the memory cell array through bit-lines in response to the control logic circuit determining the error attribute as a hard fault or a progressive fault, and
wherein the column decoder includes a register to store the first address.

10. The semiconductor memory device of claim 9, wherein the column decoder is configured to unselect a normal bit-line coupled to normal cells and a spare bit-line coupled to spare cells in response to a new access address matching the first address.

11. The semiconductor memory device of claim 9, wherein the control logic circuit is configured to program the first address stored in the register in a defective address storage table in a repair circuit in the column decoder during an idle time of the semiconductor memory device.

12. The semiconductor memory device of claim 1, wherein the buffer die includes a via ECC engine configured to correct a transmission error in data provided from at least one of the memory dies through TSVs.

13. A semiconductor memory device, comprising:
a memory cell array which includes a plurality of memory cell rows, each row including a plurality of volatile memory cells;
an error correction code (ECC) engine;
an error information register separate from the ECC engine; and
a control logic circuit configured to control the ECC engine to perform a read-modify-write operation by:
reading data corresponding to a first codeword from a sub-page in a first memory cell row among the plurality of memory cell rows based on an access address and a command;
performing an ECC decoding on the data to generate an error generation signal in response to detecting an error in the first codeword;
correcting the detected error in the first codeword; and
writing a corrected first codeword in a first memory location corresponding to the sub-page,
wherein the control logic circuit is configured to:
record, in the error information register, a first address associated with the first codeword based on the error generation signal and a first syndrome obtained by the ECC decoding;
determine an error attribute of the first codeword based on a change of the first syndrome associated with the same sub-page, recorded in the error information register, based on a multiple read-modify-write operations; and
record the error attribute of the first codeword in the error information register.

14. The semiconductor memory device of claim 13, wherein the control logic circuit is configured to repair the first memory location based on the determined error attribute during an operation of the semiconductor memory device, and
wherein the control logic circuit is configured to repair the first memory location by copying the corrected data associated with the first codeword in a redundancy region of the memory cell array or in a storage memory in the semiconductor memory device.

15. The semiconductor memory device of claim 14, wherein when the first syndrome obtained based on the multiple read-modify-write operations has non-zero values and an M-th value of the first syndrome obtained by an M-th ECC decoding is the same as an N-th value of the first syndrome obtained by an N-th ECC decoding (M is an integer greater than one and N is an integer greater than M), the control logic circuit is configured to determine the error attribute as a hard fault and repair the first memory location.

16. The semiconductor memory device of claim 14, wherein when the first syndrome obtained based on the multiple read-modify-write operations has non-zero values and an M-th value of the first syndrome obtained by an M-th ECC decoding is different from an N-th value of the first syndrome obtained by an N-th ECC decoding (M is an integer greater than one and N is an integer greater than M), the control logic circuit is configured to determine the error attribute as a progressive fault and repair the first memory location.

17. The semiconductor memory device of claim 14, wherein the control logic circuit is configured to repair the first memory cell row including the first memory location or a column associated with the first memory location based on the determined error attribute.

18. The semiconductor memory device of claim 13, further comprising a storage memory to store the first address designating the first memory location as a hard fault or a progressive fault and associated corrected data.

19. The semiconductor memory device of claim 18, wherein the control logic circuit is configured to control the storage memory such that data is input/output via the storage memory in response to a second address matching the first address.

20. A semiconductor memory device, comprising:
a memory cell array which includes a plurality of memory cell rows, each row including a plurality of volatile memory cells;
an error correction code (ECC) engine;
an error information register separate from the ECC engine; and
a control logic circuit configured to control the ECC engine to perform a read-modify-write operation by:
reading data corresponding to a first codeword from a sub-page in a first memory cell row among the plurality of memory cell rows based on an access address and a command from an external device;
performing an ECC decoding on the data to generate an error generation signal in response to detecting an error in the first codeword;
correcting the detected error in the first codeword; and
writing a corrected first codeword in a first memory location corresponding to the sub-page; and the semiconductor memory device further includes
a storage memory to store the first address designating the first memory location as a hard fault or a progressive fault and its associated corrected data,
wherein the control logic circuit is configured to:
record, in the error information register, a first address associated with the first codeword based on the error generation signal and a first syndrome obtained by the ECC decoding;
determine an error attribute of the first codeword based on a change of the first syndrome associated with the same sub-page, recorded in the error information register, based on a plurality of read-modify-write operations; and
record the error attribute of the first codeword in the error information register.

* * * * *